(12) United States Patent
Irie

(10) Patent No.: US 7,034,922 B2
(45) Date of Patent: Apr. 25, 2006

(54) EXPOSURE APPARATUS AND EXPOSURE METHOD

(75) Inventor: Nobuyuki Irie, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/898,172

(22) Filed: Jul. 26, 2004

(65) Prior Publication Data

US 2005/0062949 A1    Mar. 24, 2005

Related U.S. Application Data

(63) Continuation of application No. PCT/JP03/00800, filed on Jan. 28, 2003.

(30) Foreign Application Priority Data

Jan. 29, 2002    (JP) .............................. 2002-020336

(51) Int. Cl.
*G03B 27/42* (2006.01)
*G03B 27/54* (2006.01)
*G03B 27/72* (2006.01)

(52) U.S. Cl. .............................. 355/53; 355/67; 355/71
(58) Field of Classification Search ..................... None
See application file for complete search history.

(56) References Cited

U.S. PATENT DOCUMENTS

| 5,291,240 | A  | * | 3/1994 | Jain | .............................. | 355/53 |
| 5,437,946 | A  | * | 8/1995 | McCoy | .......................... | 430/5 |
| 6,295,119 | B1 |   | 9/2001 | Suzuki | | |
| 6,509,956 | B1 | * | 1/2003 | Kobayashi | ................... | 355/55 |
| 6,710,855 | B1 |   | 3/2004 | Shiraishi | | |
| 6,713,747 | B1 |   | 3/2004 | Tanimoto | | |
| 6,771,350 | B1 |   | 8/2004 | Nishinaga | | |
| 6,842,225 | B1 | * | 1/2005 | Irie | .............................. | 355/67 |
| 6,900,879 | B1 | * | 5/2005 | Nishi | .......................... | 355/53 |
| 2001/0018153 | A1 | | 8/2001 | Irie | | |
| 2001/0019401 | A1 | | 9/2001 | Irie et al. | | |
| 2001/0055733 | A1 | | 12/2001 | Irie et al. | | |

FOREIGN PATENT DOCUMENTS

| JP | 06-302501 | 10/1994 |
| JP | 09-223653 | 8/1997 |
| JP | 11-260716 | 9/1999 |
| JP | 2002-231613 | 8/2002 |
| JP | 2002-353108 | 12/2002 |
| WO | WO00/68738 | 11/2000 |

* cited by examiner

*Primary Examiner*—Rodney Fuller
(74) *Attorney, Agent, or Firm*—Oliff & Berridge PLC

(57) ABSTRACT

Fine patterns with the targeted line widths are formed with a high accuracy by correcting any change in image of a light-attenuating part of a density filter on a substrate arising along with a change in illumination conditions on a reticle by adjusting an amount of defocus of the density filter with respect to a reticle conjugate plane.

24 Claims, 17 Drawing Sheets

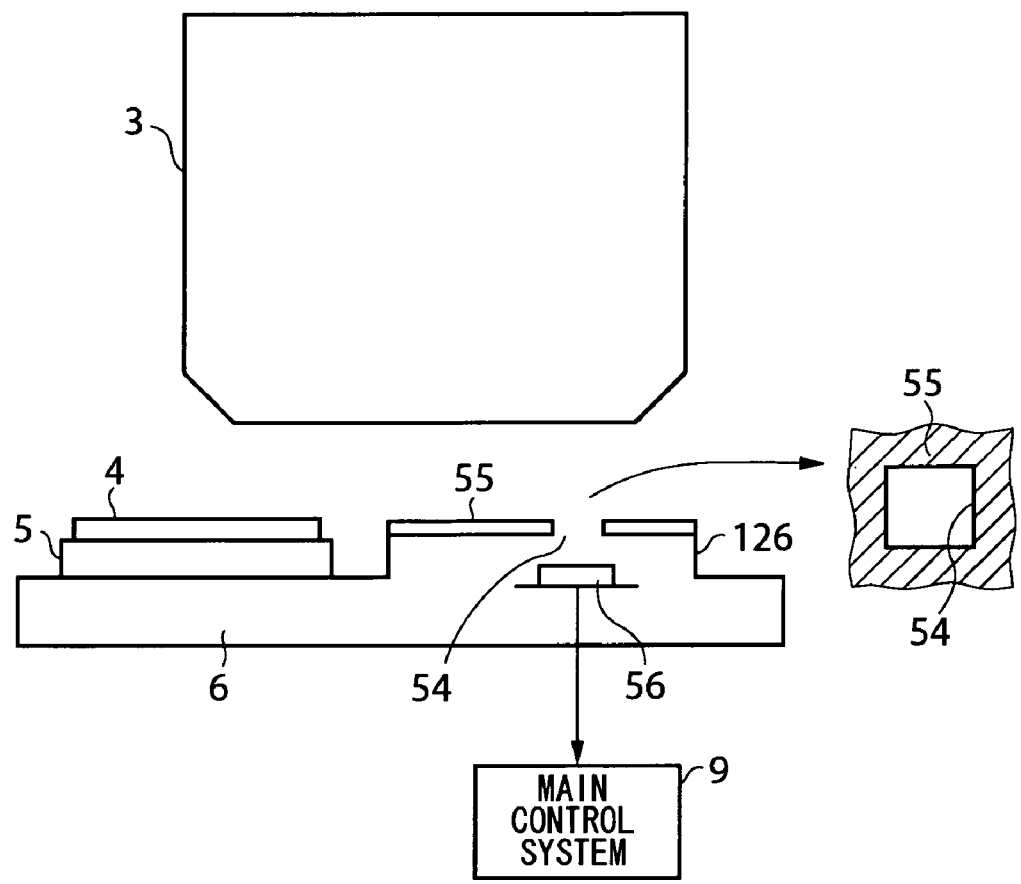
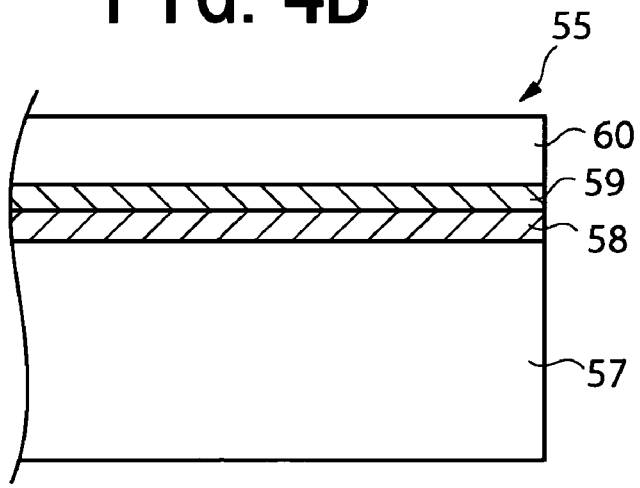

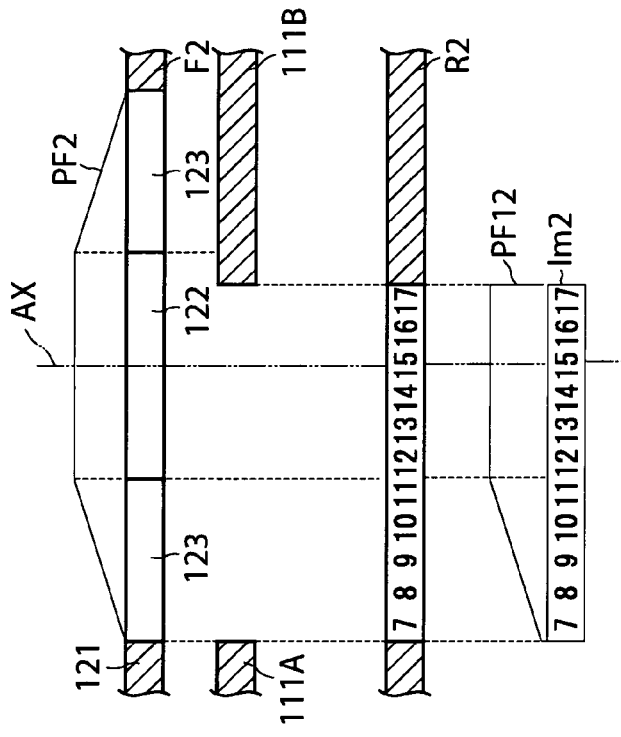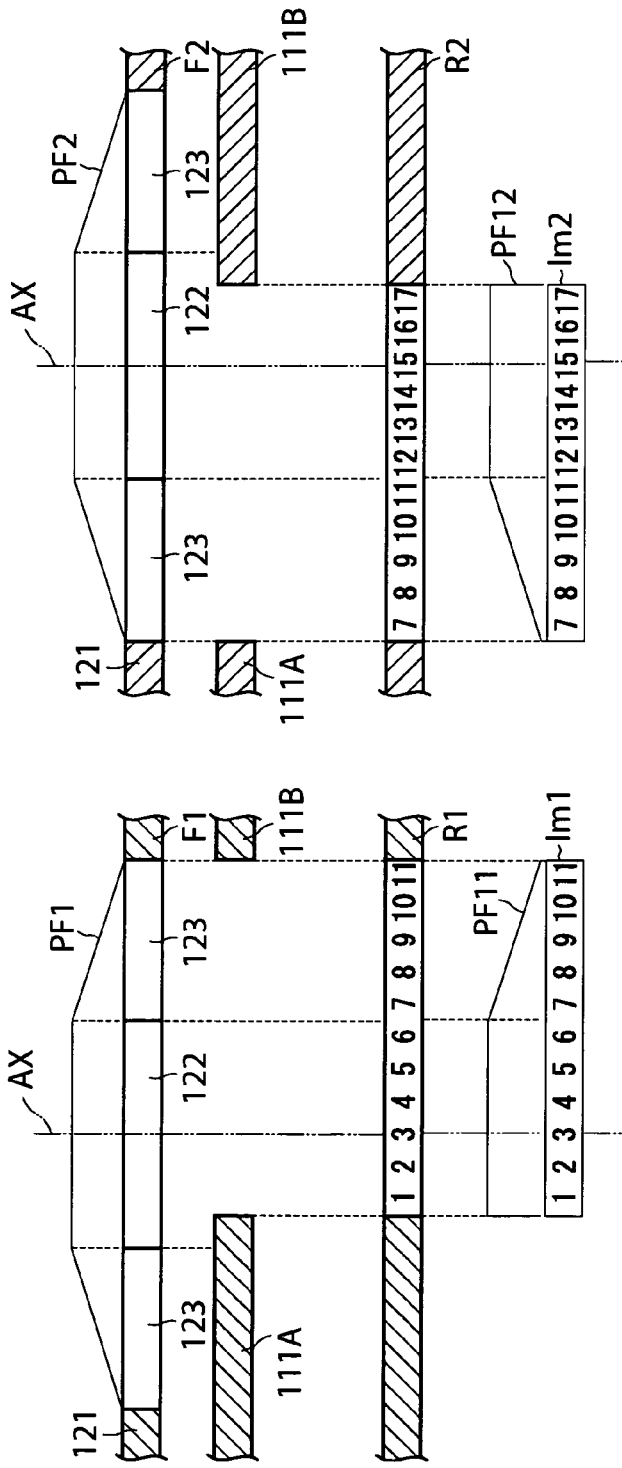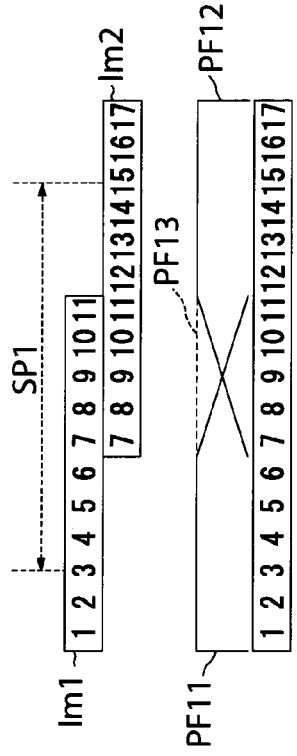

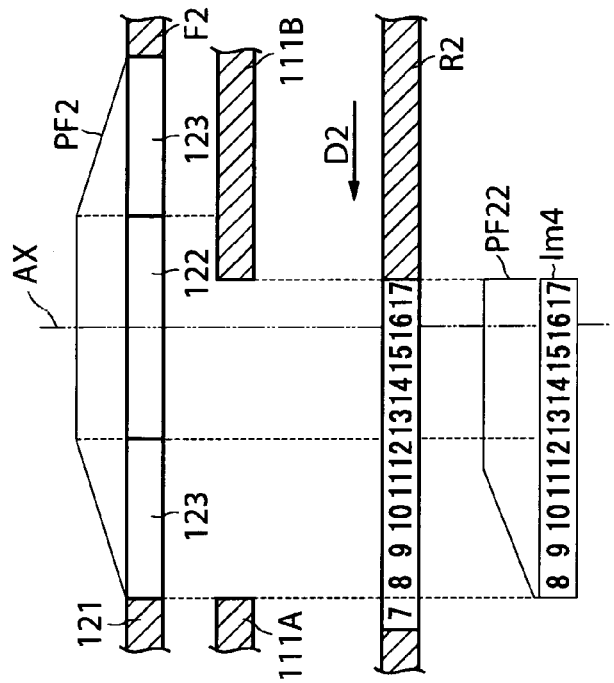
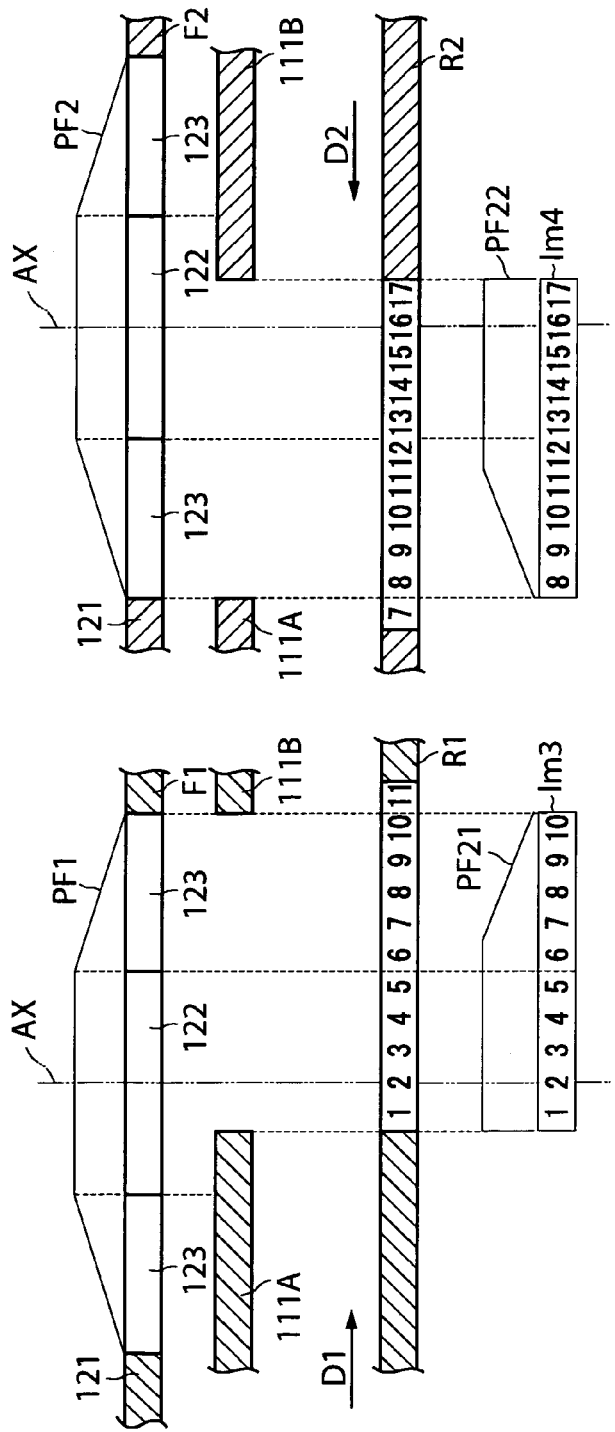
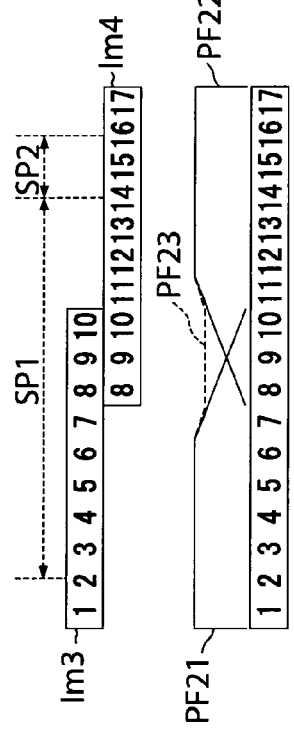

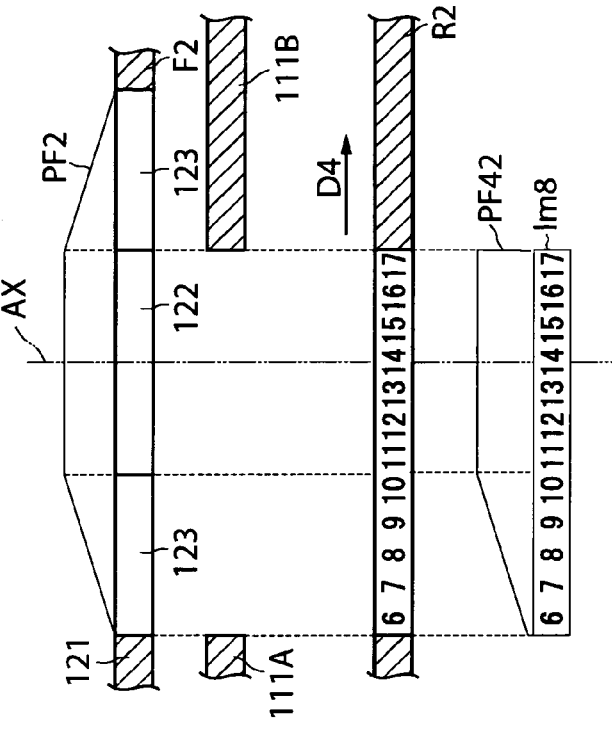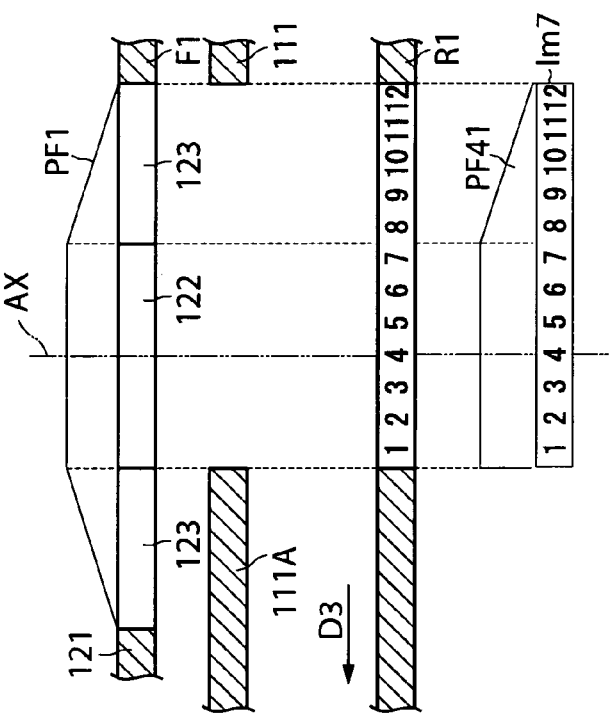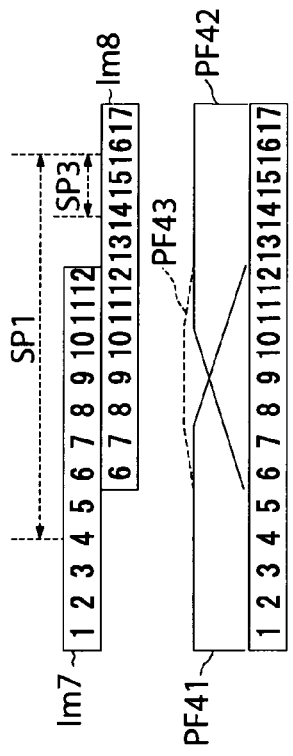

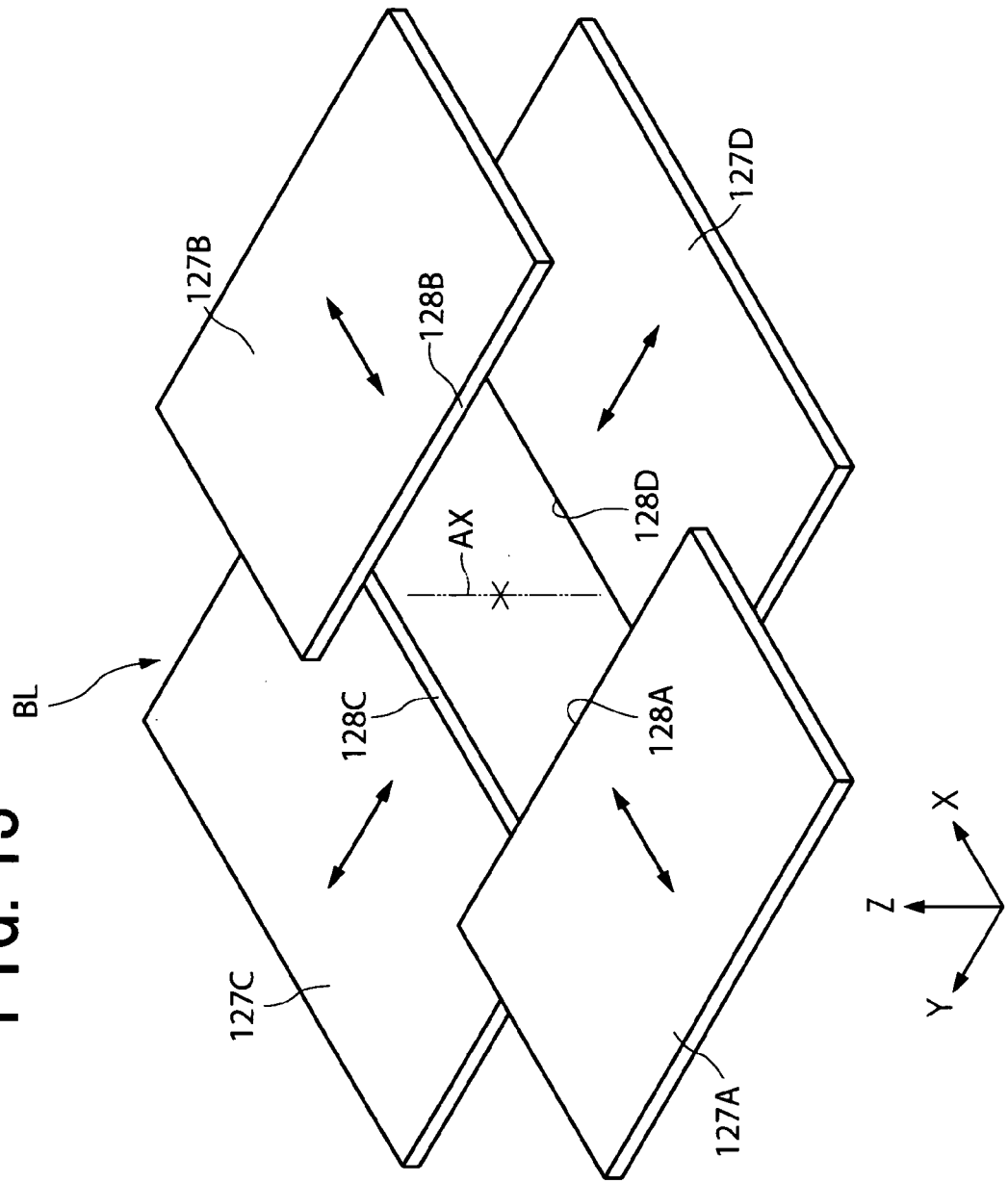

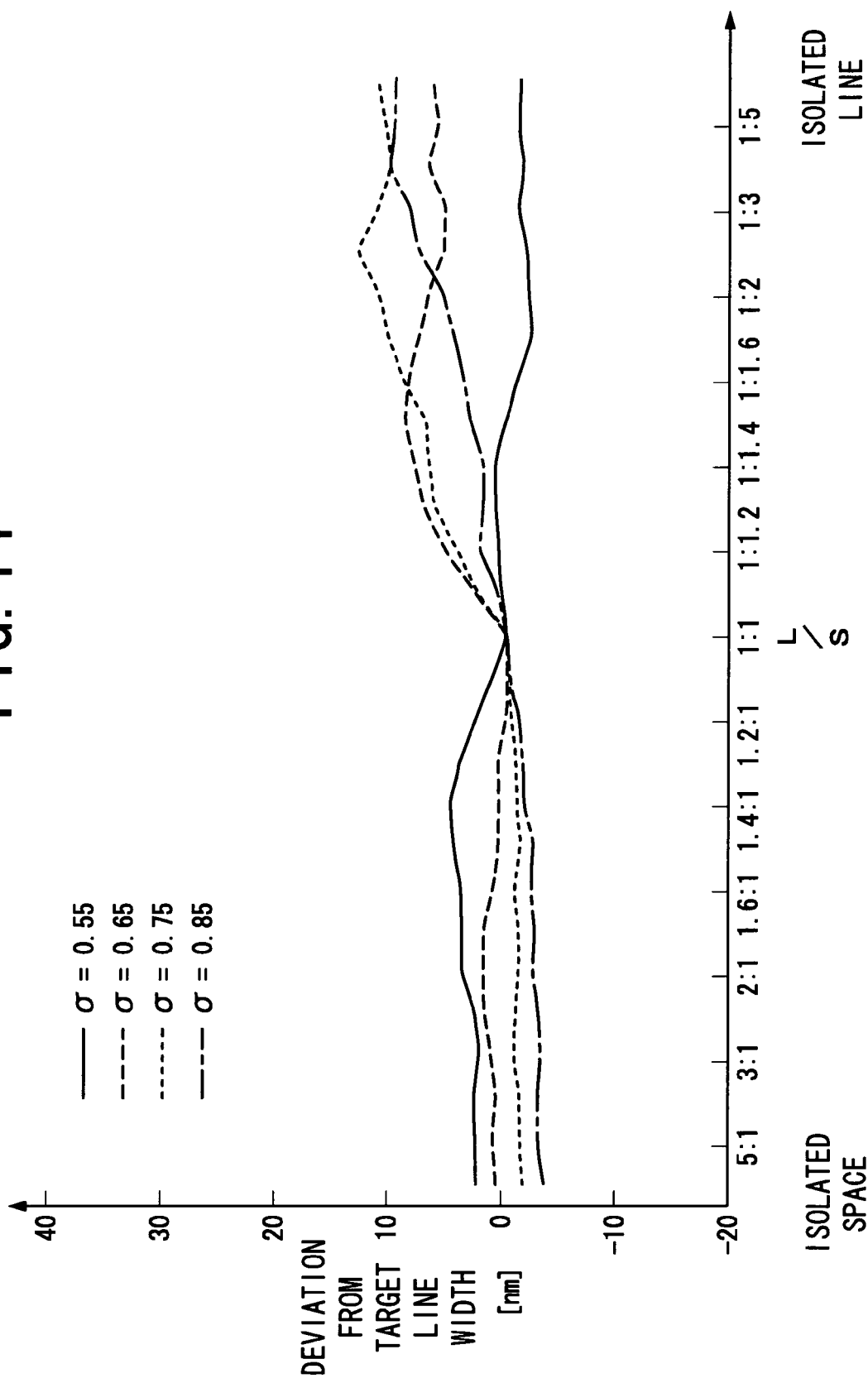

EXPOSURE APPARATUS AND EXPOSURE METHOD

This is a Continuation of Application of PCT/JP03/00800 filed Jan. 28, 2003, which in turn claims the benefit of Japanese patent application no. 2002-020336 filed Jan. 29, 2002. The entire disclosure of the prior applications is hereby incorporated by reference herein in its entirety.

TECHNICAL FIELD

The present invention relates to an exposure apparatus and exposure method used when producing a semiconductor integrated circuit, a liquid crystal display, a thin film magnetic head, or another microdevice or a photomask by photolithography.

BACKGROUND ART

In photolithography, one step in the production of a microdevice, use is made of an exposure apparatus for projection exposure of images of patterns of a photomask or reticle (hereinafter referred to generally as a "reticle") on to a substrate for exposure (semiconductor wafer or glass plate coated with a photoresist, light-transparent substrate called a "blank", etc.) In recent years, to deal with the increasingly large size of the exposure area accompanying the increased size of substrates, a stitching type exposure apparatus which partitions the exposure area of the substrate into a plurality of unit areas (hereinafter sometimes referred to as "shots" or "shot areas") and successively projects and exposes images of corresponding patterns on the shots has been developed.

In such an exposure apparatus, there was sometimes misalignment in stitched portions of shots due to aberration of the projection optical system, positioning error of the reticle or substrate, etc. Therefore, parts of the image of the patterns for one shot were superposed over parts of the images of the patterns for other shots adjoining it in the exposure. At an overlay parts of images of patterns, the exposure becomes greater than parts other than overlay parts, so for example the line width (width of lines or spaces) at overlay parts of patterns formed on the substrate becomes thinner or thicker in accordance with characteristics of the photoresist.

Therefore, the profile of exposure at parts forming overlay parts of the shots is set to a slant so as to become smaller the further toward the outside and the overall amount of exposure of overlay parts is made equal to the exposure of parts other than overlay parts by two exposures so as prevent changes in line width at these overlay parts.

As a technique for realizing a slanted profile of exposure at overlay parts of shots, it is known to form light-attenuating parts limiting in a slanting fashion the amount of light transmittance at portions of the reticle itself corresponding to overlay parts. Due to the formation of the light-attenuating parts in the reticle itself, however, the steps and cost of the manufacturing process of the reticle increase and the cost of manufacturing the microdevice etc. increase. Therefore, an exposure apparatus is being developed which is provided with a density filter formed with light-attenuating parts similar to the above on a glass plate at positions substantially conjugate with the pattern formation surface of the reticle or which is provided with a blind mechanism having light-blocking plates (blinds) able to advance into or retract from the optical path at positions substantially conjugate with the pattern formation surface of the reticle and realizes a slanted profile of exposure by making the light-blocking plates advance or retract during the exposure of the substrate.

When using the above-mentioned exposure apparatus to transfer the patterns of a reticle to a substrate, however, it is required that the pattern density dependency of $\Delta CD$ (OPE characteristic: optical proximity effect) be small. Here, "$\Delta CD$" means the amount of deviation of the patterns to be formed on the substrate with respect to the target line width (line width error). The "OPE characteristic" means the characteristic of change of the $\Delta CD$, even when the line widths of the patterns on the reticle are the same, depending on whether the patterns are isolated patterns or dense patterns and also whether they are lines or spaces. Further, the degree of change of the $\Delta CD$ does not only depend on the density of the patterns and is known to also depend on the wavelength of the illumination light irradiated on the reticle, the numerical aperture (NA) of the projection optical system, the pattern size, the illumination $\sigma$ ($\sigma$value=emission side numerical aperture of illumination system/incident side numerical aperture of projection optical system), etc.

Here, an example of the OPE characteristic of an exposure apparatus provided with a KrF excimer laser (wavelength: 248 nm) light source and provided with a 0.75 numerical aperture projection optical system will be explained. FIG. 14 is a view of the OPE characteristic when changing the density of patterns with a pattern size of 360 nm and illumination $\sigma$. FIG. 15 is a view of the OPE characteristic when changing the density of patterns with a pattern size of 200 nm and illumination $\sigma$. The "pattern size" spoken of here is the size (line width) of the patterns on the substrate. In FIG. 14 and FIG. 15, the abscissa gives the ratio of the lines and spaces and the ordinate gives the amount of deviation ($\Delta CD$) from the target line width.

Referring to FIG. 14, it will be understood that when the pattern size is 360 nm, the amount of deviation from the target line width when changing the ratio of lines and spaces tends to deteriorate as the patterns become isolated lines except when setting the illumination $\sigma$ to 0.55. Further, from the results of FIG. 14, it will be understood that when setting the illumination $\sigma$ to 0.55, the extent of the amount of deviation from the target line width when changing the density of the patterns (extent of $\Delta CD$) becomes the minimum, so the optimal illumination $\sigma$ for the pattern size (360 nm) is 0.55.

Next, referring to FIG. 15, it will be understood that when the pattern size is 200 nm, the amount of deviation from the target line width when changing the ratio of lines and spaces tends to deteriorate as the patterns become isolated lines regardless of the setting of the illumination $\sigma$. Further, in the results shown in FIG. 15, the extent of the amount of deviation from the target line width (extent of $\Delta CD$) when changing the density of the patterns becomes the minimum when setting the illumination $\sigma$ to 0.85, so it will be understood that the illumination $\sigma$ optimal for the pattern size (200 nm) is 0.85. From the above, to improve the OPE characteristic (pattern density dependency of $\Delta CD$), it is necessary to set the optimal illumination $\sigma$ for each pattern size.

However, if for example changing the illumination $\sigma$ for each pattern size of the patterns for transfer in order to improve the above OPE characteristic, the widths of the overlay parts of the shots explained above will end up changing. The reason is that when using a density filter having light-attenuating parts changing the probability of presence of fine dots for example in order to obtain a slanted profile of exposure at the overlay parts of the shots, sometimes the fine dots are prevented from being resolved by arranging the density filter off from the conjugate plane of the pattern forming surface of the reticle. At the time of such an arrangement, if changing the illuminations, the incident angle of the light rays on the density filter will end up changing and as a result the width of the overlay parts of the shots will change.

FIG. 16 is a view of the changes in the profile of exposure when changing the illumination σ, while FIG. 17 is a view of the amount of exposure at the overlay parts when changing the illumination σ. In FIG. 16 and FIG. 17, PR0 is the profile of exposure when setting the illumination σ at the standard value. Further, W is the width of an exposure area (width of transfer of patterns) when setting the illumination σ at the standard value, while W0 is the width of an overlay part. Further, PR1 is the profile of exposure when reducing the illumination σ, while PR2 is the profile of exposure when increasing the illumination σ.

As will be understood from FIG. 16 and FIG. 17, if reducing the illumination σ, the width of an overlay part changes by being reduced from W0 to W1 and the gradient of the amount of exposure at the overlay part becomes sharp. Therefore, if even a slight offset in position of the shots occurs, the amount of exposure of the overlay part for the offset will change greatly and as a result the change in line width will become sensitive to the offset. Conversely, if increasing the illumination σ, the width of the overlay part will change by being enlarged from W0 to W2 and the gradient of the amount of exposure at the overlay part will become gentler, so the change of the amount of exposure of the overlay part for offset of the shots will become smaller. However, part of the overlay part will be enlarged outside of the exposure area and that part outside of the exposure area will end up being blocked by a light-blocking strip formed at the reticle.

As shown in FIG. 17, when setting the illumination σ at the standard value, the combined amount of exposure PR10 at the overlay part W0 will become the same as the amount of exposure outside of the overlay part. Even if the illumination His reduced, the combined amount of exposure PR11 at the overlay part W1 will become the same as the amount of exposure outside of the overlay part W2. However, if increasing the illumination σ, locations will arise (locations shown by the symbol Q in FIG. 17) where the combined amount of exposure PR12 in the overlay part W2 differs from the amount of exposure outside the overlay part, so the line width will change in the overlay part W2.

In this way, in the past, there was the problem that if for example changing the illumination σ or other illumination conditions to improve the OPE characteristic, the amount of change in the combined amount of exposure of an overlay part with respect to offset of the shots became greater and there was a susceptibility to changes in line width and also locations arose where the combined amount of exposure in the overlay part became insufficient and changes in line width occurred in the overlay part.

DISCLOSURE OF THE INVENTION

The present invention was made in consideration of these problems in the prior art and has as its object to provide an exposure apparatus and an exposure method enabling the formation of fine patterns of the targeted line widths with a high accuracy (fidelity) without the amount of exposure at an overlay part becoming insufficient and without the occurrence of a change in the amount of exposure at an overlay part sensitive to positional error of the shots even when changing the illumination conditions.

According to a first aspect of the present invention, there is provided an exposure apparatus which irradiates a plurality of areas where peripheral parts partially overlap on a sensitive object by an energy beam through patterns, comprising a setting device which sets cumulative amounts of energy at the peripheral parts due to the irradiation by the energy beam to become a gradually decreasing slanted profile and a correction device which corrects changes in widths of peripheral parts arising along with a change in the illumination conditions of the patterns.

If changing the illumination conditions, as explained above, the widths of the peripheral parts where the cumulative amount of energy is set at a slant change and the cumulative amounts of energy at the overlay parts where the peripheral parts overlap with other peripheral parts adjoining them will not become the desired value. As opposed to this, in the present invention, even if the illumination conditions are changed, the widths of the peripheral parts are kept from changing by correction by the correction device, so even if changing the illumination conditions, the widths of the overlay parts can be set to the desired value. Therefore, there will no longer be cases where the cumulative amount of energy becomes partially insufficient in an overlay part or the amount of energy at an overlay part changes sensitively with respect to positional error of the areas where the patterns are transferred and the cumulative amounts of energy at the overlay parts can be uniformly set to the desired value. As a result, it is possible to form fine patterns of the targeted line widths with a high accuracy and fidelity.

The setting device is not particularly limited, but it is possible to employ one including a density filter having a light-attenuating part for gradually reducing the passed amount of energy of the parts of the energy beam corresponding to the peripheral parts or a blind mechanism having light attenuating plates for entering into and retracting from the irradiation of the energy beam at the parts of the energy beam corresponding to the peripheral parts. Note that this setting device is preferably arranged near the patterns or near a plane conjugate optically with the patterns.

The setting device may include a position adjustment device which adjusts the position of the density filter or blind mechanism in the direction along the path of the energy beam. In this case, by moving the density filter or blind mechanism in a direction along the path of the energy beam in accordance with a change in the illumination conditions, it is possible to adjust the widths of the overlay parts. Further, it is possible to adjust the widths of the peripheral parts by moving the blind mechanism in a direction perpendicular to the path of the energy beam.

As the setting device, it is possible to employ one including a plurality of density filters differing in widths of the light-attenuating parts. In this case, it is possible to correct the widths of the peripheral parts by changing the density filter positioned on the path of the energy beam with a density filter able to correct changes in the widths of the peripheral parts in accordance with a change in the illumination conditions.

The correction device may correct the widths of the peripheral parts without changing the position of the setting device or, along with this, adjusting the optical characteristics of the optical elements arranged on the path of the energy beam from the setting device to the patterns.

When the overlay parts where peripheral parts overlap and parts other than the overlay parts differ in cumulative amounts of energy along with correction of the widths of the peripheral parts or desiring intentionally to make the cumulative amounts of energy different, the relative position between the profile of the energy beam defined by the setting device and the patterns may be changed to adjust the cumulative amounts of energy at the overlay parts where the peripheral parts overlap.

According to a second aspect of the present invention, there is provided an exposure method which transfers patterns to a plurality of areas where peripheral parts partially overlap on a sensitive object by irradiating areas with an energy beam through a setting device setting the cumulative amounts of energy at the peripheral parts to a gradually declining profile, said exposure method comprising an illumination condition changing step of changing the illumination conditions in accordance with the configuration of the patterns and a correction step of correcting the widths of the peripheral parts in accordance with the illumination conditions.

In this case, the correction step may include a position adjustment step of adjusting the position of the setting device in a direction along the path of the energy beam. Further, the correction step may include a characteristic adjustment step of adjusting the optical characteristics of optical elements arranged on the path of the energy beam from the setting device to the patterns. When the overlay parts where peripheral parts overlap and parts other than the overlay parts differ in cumulative amounts of energy along with correction of the widths of the peripheral parts or desiring intentionally to make the cumulative amounts of energy different, it is possible to further provide an energy adjustment step of changing the relative position between the profile of the energy beam defined by the setting device and the patterns to adjust the cumulative amounts of energy at overlay parts where the peripheral parts are overlapped.

According to a third aspect of the present invention, there is provided a method of manufacture of a device including a step of forming circuit patterns on an object using the exposure method according to the second aspect of the invention.

BRIEF DESCRIPTION OF THE DRAWINGS

FIG. 4A and FIG. 4B are views of the configuration of an illumination profile detection sensor;

FIG. 9A to FIG. 9C are views for explaining a method of adjustment of the profile of exposure;

FIG. 10A to FIG. 10C are views for explaining a method of adjustment of the profile of exposure;

FIG. 12A to FIG. 12C are views for explaining a method of adjustment of the profile of exposure;

FIG. 13 is a view of another example of a configuration for forming a slanted profile;

FIG. 14 is a view of the OPE characteristic when changing the density of patterns with a pattern size of 360 nm and the illumination σ;

BEST MODE FOR WORKING THE INVENTION

Figure 1:
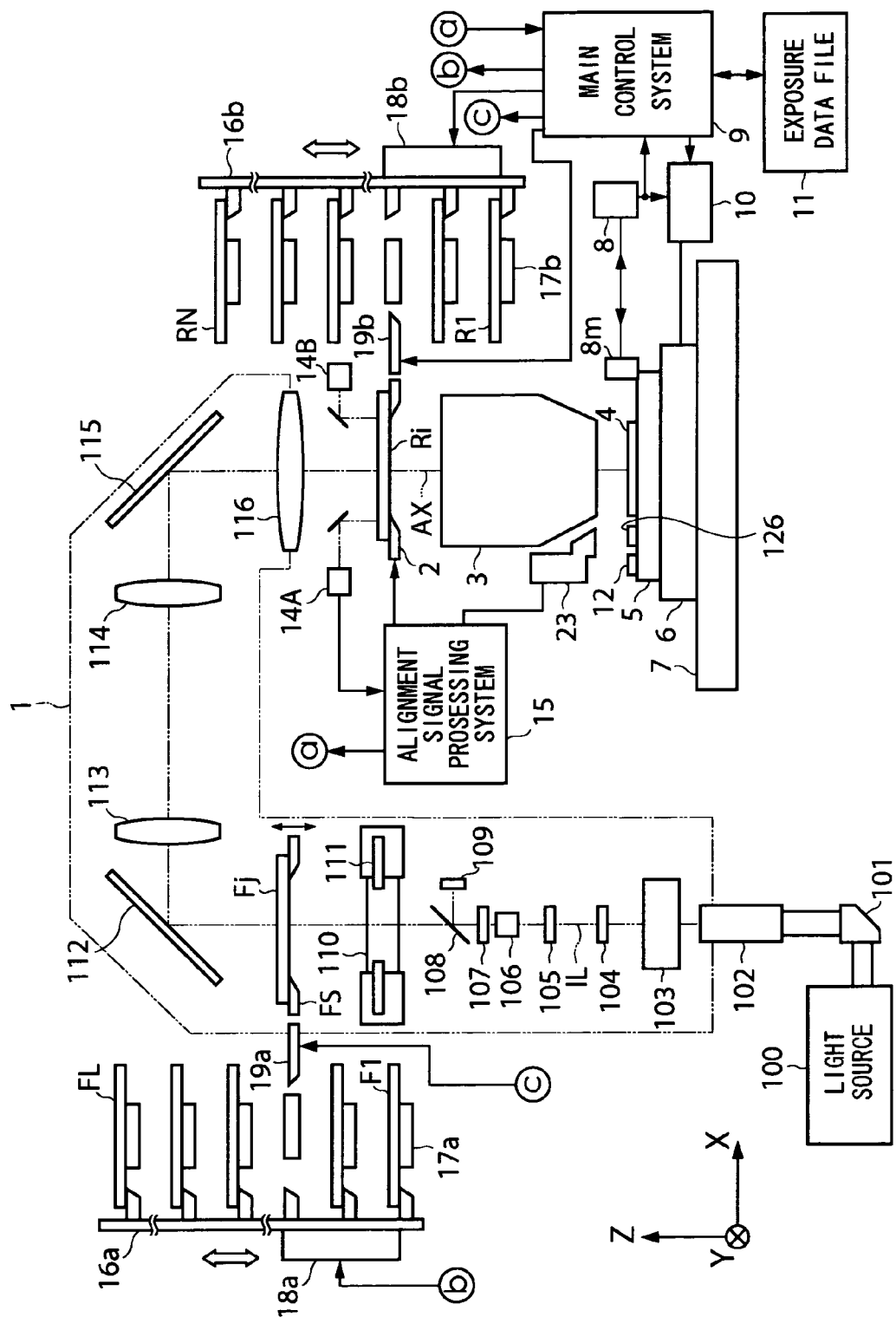
FIG. 1 is a view of the general configuration of an exposure apparatus according to an embodiment of the present invention.

Below, an explanation will be given of an embodiment of the present invention with reference to the drawings. FIG. 1 is a view of the general configuration of an exposure apparatus according to an embodiment of the present invention. The exposure apparatus is a step-and-repeat type stitch projection exposure apparatus. Further, in the following explanation, the XYZ orthogonal coordinate system shown in FIG. 1 is set and the positional relationships of the members explained while referring to the XYZ orthogonal coordinate system. The XYZ orthogonal coordinate system is set so that the X-axis and the Z-axis become parallel to the paper surface and so that the Y-axis becomes the direction perpendicular to the paper surface. Further, the XYZ coordinate system in the figure is set so that the XY plane becomes a plane parallel to the horizontal surface and the Z-axis becomes the vertical direction.

In FIG. 1, the ultraviolet pulse light IL of the light from a light source 100 (here, a KrF excimer laser with a wavelength of 248 nm) (hereinafter referred to as the "exposure light IL") passes through a beam matching unit (BMU) 101 including movable mirrors etc. for matching of the position of the optical path with the illumination optical system 1 and enters a variable light-attenuator 103 serving as a light-attenuator through a pipe 102.

A main control system 9 controls the exposure of the resist on the substrate 4 by communicating with the light source 100 to start and stop emission of light and control the output as determined by the oscillation wavelength and the pulse energy and to adjust the light-attenuation rate of the variable light-attenuator 103 with respect to the exposure light IL in stages or continuously.

The exposure light IL passing through the variable light-attenuator 103 passes through a beam shaping optical system comprised of lens systems 104 and 105 arranged along a predetermined optical axis and enters an optical integrator (homogenizer) 106. In this example, a fly-eye lens is used as the optical integrator 106, so below the optical integrator will also be called a "fly-eye lens 106". Here, the instead of using a fly-eye lens as the optical integrator 106, it is also possible to employ a rod integrator (inside surface reflection type integrator) or a diffraction optical element etc. Further, two fly-eye lenses 106 may be arranged in series to enhance the uniformity of illumination profile.

An aperture stop system 107 is arranged at the emission surface of the fly-eye lens 106. The aperture stop system 107 includes a circular aperture stop for normal illumination, an aperture stop for modified illumination comprised of a plurality of small offset apertures, an aperture stop for annular illumination, etc. arranged in a switchable manner. Therefore, in this example, the profile of exposure of the exposure light IL on the pupil plane of the illumination optical system (magnitude (corresponding to illumination σ) or shape of the secondary light source), that is, the illumination conditions of a master reticle Ri, can be freely changed by the aperture stop system 107. Further, instead of the aperture stop system 107 or in combination with it, it is possible to arrange between the light source 100 (in particular the variable light attenuator 103 or the lens systems 104 and 105) and optical integrator 106, to give a profile of exposure light IL at different areas on the pupil plane of the illumination optical system 1, a plurality of diffraction optical elements arranged switchably in the illumination optical system or a plurality of prisms (conical prisms, polyhedron prisms, etc.) at least one of which is movable along the optical axis AX of the illumination optical system 1 and an optical unit (illumination condition changing device) including at least one zoom optical system so as to make the distance in the optical axis direction of the illumination optical system 1 variable so as to make the profile of intensity of the exposure light IL on the incident surface variable when the optical integrator 106 is a fly-eye lens and make the incident angle range of the exposure light IL on the incident surface variable when the optical integrator 106 is an inside surface reflection type integrator and thereby suppress the loss in the amount of light accompanying a change of the illumination conditions. Further, in this example, the plurality of light source images (imaginary images) formed by the inside surface reflection type integrator are also called "secondary light sources". Further, the changes in the illumination conditions in this example are not limited to the illumination σ, that is, the magnitude of the secondary light sources, and includes changes in its shape as well.

The illumination light IL emitted from the fly-eye lens 106 and passing through a predetermined aperture stop of the aperture stop system 107 enters a beam splitter 108 having a high transmittance and a low reflectance. The light reflected at the beam splitter 108 enters an integrator sensor 109 comprised of a photoelectric detector. The detection signal of the integrator sensor 109 is supplied through a not illustrated signal line to the main control system 9.

The transmittance and reflectance of the beam splitter 108 are measured to a high accuracy in advance and stored in a memory in the main control system 9. The main control system 9 is designed to be able to monitor the intensity (or amount) on the substrate 4 of the exposure light IL indirectly passing through the projection optical system 3 by the detection signal of the integrator sensor 109.

The exposure light IL passing through the beam splitter 108 enters a reticle blind mechanism 110. The reticle blind mechanism 110 is comprised of four movable blinds 111 (light-blocking plates) 111 (A–D) and their drive mechanisms (for example, linear motors etc.) In this embodiment, the reticle blind mechanism 110 has the four blinds 111 arranged at a plane substantially conjugate with the pattern formation surface of a master reticle Ri. By setting these four blinds 111 at suitable positions, a rectangular illumination area is formed in the field of the projection optical system 3 (in this case, circular). Further, in the illumination optical system 1, the four blinds 111 may also be arranged separated from the plane conjugate with the pattern formation surface of the master reticle Ri, for example, substantially conjugate with a density filter Fi.

Figure 2A:
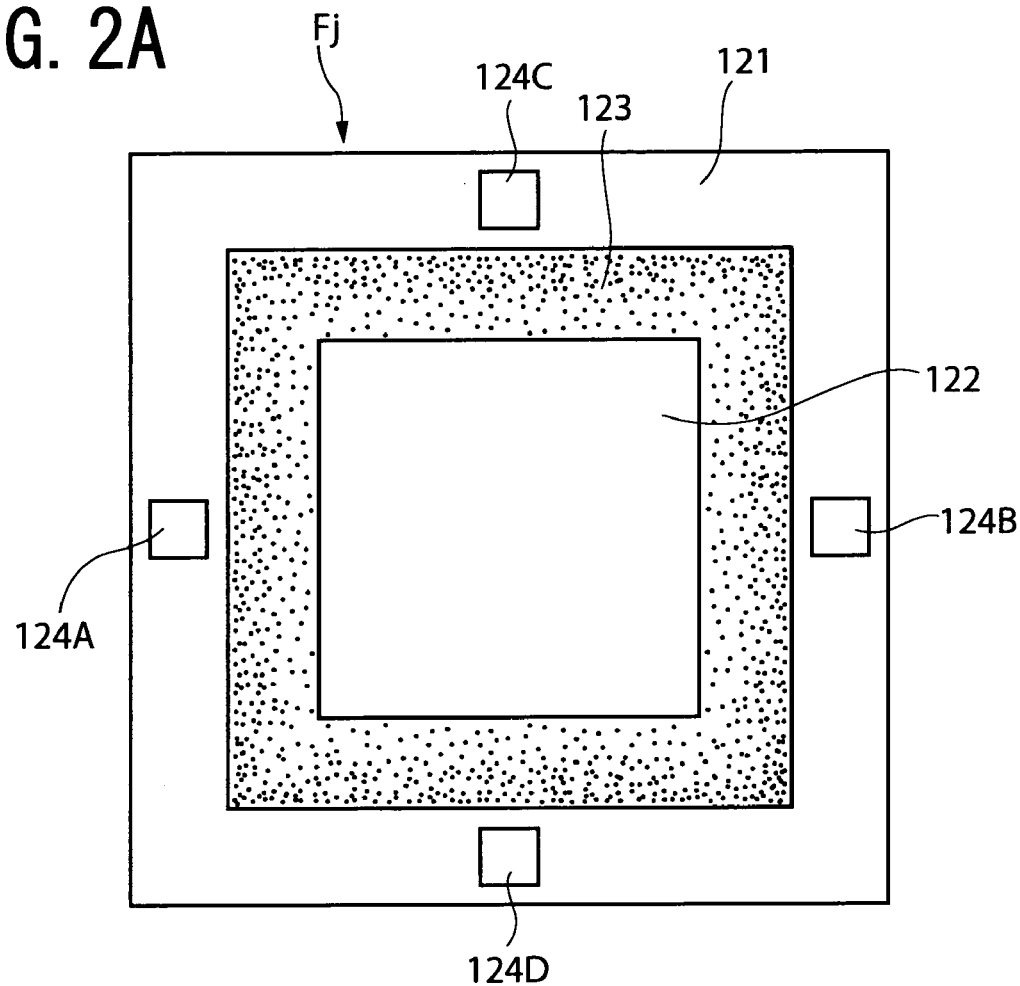
FIG. 2A is a top view of an example of the configuration of a density filter.

The exposure light IL shaped into a rectangle by the blinds 111 of the reticle blind mechanism 110 enters the density filter Fj serving as the setting device (light-attenuating member) carried on the filter stage FS. In this embodiment, the density filter Fj is arranged away from the plane substantially conjugate with the pattern formation surface of the master reticle Ri in the reticle blind mechanism 110, that is, in the illumination optical system 1, by exactly a predetermined distance. The density filters Fj (here comprised of F1 to F9) is configured basically as shown in FIG. 2A. FIG. 2A is a top view of an example of the configuration of a density filter Fj. This density filter Fj is comprised of a light-transmitting substrate such as quartz glass, fluorine-doped quartz glass, etc. on which is formed a light-blocking part 121 on which chrome or another light-blocking material is deposited, a light-transmitting part 122 on which no light-blocking material is deposited, and a light-attenuating part (attenuating part) 123 on which the light-blocking material is deposited while changing the probability of presence.

The light-attenuating part 123 has the light-blocking material deposited on it in dots. The size of the dots becomes less than the resolution limit of the optical system having the plurality of optical elements (112 to 116) arranged between the density filter Fj and the master reticle Ri in this example in the state where the density filter Fj is placed at the position shown in FIG. 1. The dots are formed to increase in probability of presence so that the light-attenuation rate becomes higher linearly at a slant from the inside (light-transmitting part 122 side) to the outside (light-blocking part 121 side). However, these dots may also be formed to increase in probability of presence so that the light-attenuating rate becomes higher in a curve from the inside to the outside.

The method of arrangement of the dots is preferably not by arrangement of dots by the same pitch P at predetermined areas giving the same transmittance, but by arrangement by addition to P of a random number R having a Gaussian profile generated for each dot, that is, a P+R system. The reason is that diffracted light is produced by the arrangement of dots. In some cases, the numerical aperture (NA) of the illumination system is exceeded and light does not reach the photosensitive substrate and therefore the error from the design transmittance becomes large.

Further, the sizes of the dots are preferably all the same. The reason is that if several sizes of dots are used, when error occurs from the design transmittance due to the aforementioned diffraction, the error becomes complicated, that is, correction of the transmittance becomes complicated. Note that a density filter is preferably produced by a high speed electron beam lithography system so as to reduce the error in the dot shape. Further, the shape of the dots is preferably a rectangular shape (square shape) for which process errors in shape can be easily measured. This has the advantage of easy correction of the transmittance in the case of any measurable shape error.

Figure 2B:
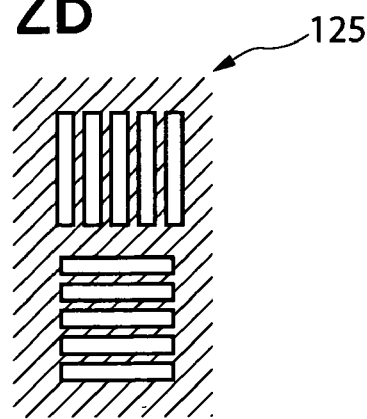
FIG. 2B is a view of an example of marks formed on a density filter.

The light-blocking part 121 is formed with a plurality of alignment marks 124A, 124B, 124C, and 124D. These marks 124A, 124B, 124C, and 124D, as shown in FIG. 2A, can be formed by removing parts of the light-blocking part 121 of the density filter Fj to form rectangular or other shaped apertures (light-transmitting parts) 124A, 124B, 124C, and 124D. Further, it is also possible to use a mark shown in FIG. 2B. FIG. 2B is a top view of an example of a mark formed on a density filter Fj. In FIG. 2B, a slit mark 125 comprised of a plurality of slit-shaped apertures is employed. This slit mark 125 is comprised of a combination of a mark element comprised of slits formed in a Y-direction aligned in an X-direction and a mark element comprised of slits formed in an X-direction aligned in a Y-direction for measurement of the positions in the X-direction and Y-direction. The positions and the projection magnification of the density filter Fj are adjusted based on the results of measurement of the positional information of the marks 124A, 124B, 124C, and 124D.

Further, the number of marks set at the density filter is not limited to four. It is sufficient to set one or more in accordance with the accuracy of setting etc. of the density filter. Further, in this example, the density filter was arranged so as to substantially match with the optical axis of the illumination optical system at its center and four marks were provided symmetrically with respect to the center (optical axis), but when providing a density filter with a plurality of marks, it is preferable to arrange the marks not to become point symmetric about the center or to arrange a plurality of marks point symmetrically and form a separate recognition pattern. This is because, when arranging a density filter in an illumination optical system, measuring the energy profile, then taking out the density filter, correcting it, and resetting it, since the density filter is corrected considering the optical characteristics of the illumination optical system (distortion etc.), the correction would become meaningless if the density filter were reset rotated in position. This arrangement enables the density filter to be reset at the original state.

The filter stage FS indexes or moves the held density filter Fj in the XY plane in the rotational direction and the translational direction. The X-coordinate, Y-coordinate, and rotational angle of the filter stage FS are measured by not shown laser interferometers. The operation of the filter stage FS is controlled by the measured values and the control information from the main control system 9. Further, in the present embodiment, the filter stage FS is configured to be movable in the Z-direction.

As explained above, the light-attenuating part 123 of a density filter Fj has the light-blocking material deposited on it in dots. To prevent the dots from being resolved on the reticle, the density filter Fj is arranged at a position defocused by a predetermined amount from the plane conjugate with the pattern formation surface of the master reticle. Therefore, if using the aperture stop system 107 to change the emission side numerical aperture (illumination σ) of the illumination optical system 1 to change the incident angle (incident angle range) of the light beam on the density filter Fj, the width of the image of the light-attenuating part 123 on the master reticle Ri on the substrate 4 will change and in turn the widths of the overlay parts on the substrate 4 will change. Therefore, in the present embodiment, the change in the widths of the overlay parts is corrected by controlling the amount of defocus of the density filter Fj with respect to the plane conjugate with the pattern formation surface of the master reticle. Note that the details of the method of control of the amount of defocus will be explained later. Further, even if changing not only the magnitude of the illumination σ, that is, the secondary light source, but also its shape, the incident angle range of the light beam on the density filter Fj will similarly change.

For the position of the density filter Fj in the Z-direction and the amount of tilt in the Z-direction, a device for detecting by an imaging element the masks of the density filter Fj provided at least in part at the sample holder 5 is used to measure the marks 124A, 124B, 124C, and 124D or the mark 125 at a plurality of Z-directions by moving the density filter Fj in the optical axis direction. The Z-position giving the largest signal intensity or signal contrast is designated as the best focus position, and the amount of defocus is controlled based on that best focus position.

In the present embodiment, a shelf-like filter library 16*a* is arranged at the side of the filter stage FS. The filter library 16*a* has L number (L is a natural number) of support shelves 17*a* successively arranged in the Z-direction. Density filters F1, . . . , FL are carried on the support shelves 17*a*. The filter library 16*a* is supported to be movable in the Z-direction by a slider 18*a*. A loader 19*a* able to freely rotate and provided with an arm able to move in a predetermined range in the Z-direction is arranged between the filter stage FS and the filter library 16*a*. The main control system 9 adjusts the position of the filter library 16*a* in the Z-direction through the slider 18*a*, then controls the operation of the loader 19*b* to enable transfer of desired density filters F1 to FL between the desired support shelves 17*a* of the filter library 16*a* and the filter stage FS. While details are explained later, the master reticle Ri is any of a plurality of master reticles R1 to RN and is a reticle formed with parent patterns P1 to PN dividing the parent pattern 36.

In the present embodiment, as shown in FIG. 3A to FIG. 3I, a total of nine density filters Fj, that is, F1 to F9, are provided. FIG. 3A to FIG. 3I are views of the configurations of density filters provided at the exposure apparatus according to the embodiment of the present invention. These differ from each other in the shapes or positions of the light-attenuating parts 123 and are selectively used in accordance with whether there are portions where the images of patterns overlap between adjoining shot areas at the four sides of the shot areas to be exposed (stitched parts).

Figure 3A:
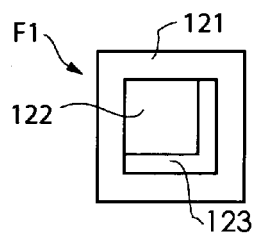
FIG. 3A to FIG. 3I are views of variations of the configuration of the light-attenuating part of a density filter.
Figure 3B:
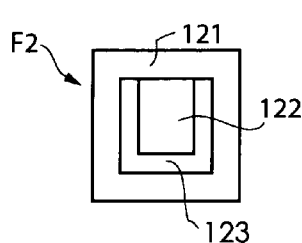
Figure 3C:
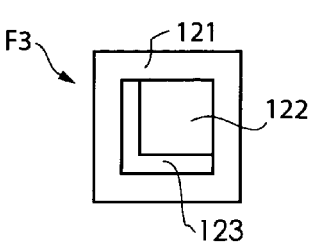
Figure 3D:
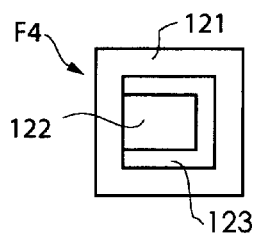
Figure 3E:
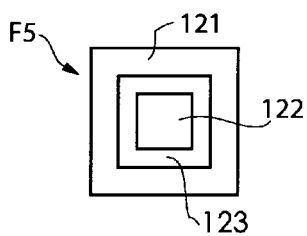
Figure 3F:
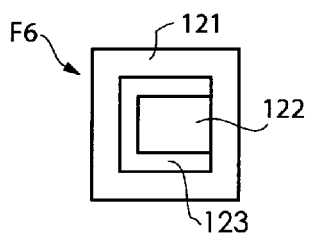
Figure 3G:
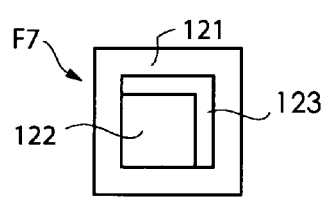
Figure 3H:
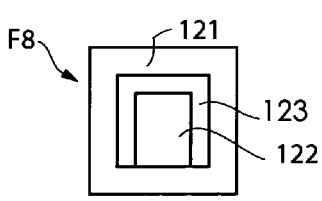
Figure 3I:
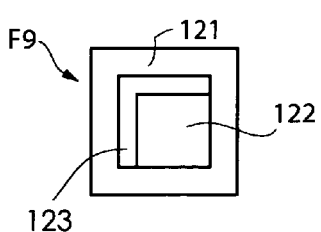

That is, in the case of a shot area array of a matrix of p (rows)×q (columns), the density filter of FIG. 3A is used for the shot area (1, 1), the density filter of FIG. 3B is used for the shot (1, 2 to q−1), the density filter of FIG. 3C is used for the shot (1, q), the density filter of FIG. 3D is used for the shot (2 to p−1, 1), the density filter of FIG. 3E is used for the shot (2 to p−1, 2 to q−1), the density filter of FIG. 3F is used for the shot (2 to p−1, q), the density filter of FIG. 3G is used for the shot (p, 1), the density filter of FIG. 3H is used for the shot (p, 2 to q−1), and the density filter 3I is used for the shot (p, q).

Further, the density filter Fj is not limited to the above nine types. It is possible to employ ones having other shapes of light-attenuating parts 123 in accordance with the shot shapes or shot arrays.

If the density filter Fj is made able to be used rotated 90 degrees or 180 degrees, by preparing for example the three types of the density filter Fj of FIG. 3A, FIG. 3B, and FIG. 3E, other density filters become unnecessary. Further, by using the single density filter Fj shown in FIG. 3E (that is, the one with the detailed configuration shown in FIG. 2A), selectively setting the positions of the four blinds 111 of the reticle blind mechanism 110, or using the light-blocking stripes of the master reticle Ri and blocking one or more of the four sides of the light-attenuating part 123 by the corresponding blinds 111, it is possible to realize the functions of the density filters shown in FIG. 3A to FIG. 3I and other density filters by a single density filter.

Further, the density filter Fj is not limited to one comprised of a glass substrate formed with a light-attenuating part or light-blocking portion by chrome or another light-blocking material. Use may also be made of one using liquid crystal elements etc. to enable the positions of the light-blocking part or light-attenuating part and the light-attenuating characteristics of the light-attenuating part to be changed in accordance with need. In this case, there is no longer a need to prepare several density filters and various demands in the specifications of the working reticles (microdevices) produced can be flexibly dealt with.

The exposure light IL passing through a density filter Fj travels via a reflection mirror 112 and condenser mirror system 113, an imaging lens system 114, a reflection mirror 115, and a main condenser lens system 116 to strike an illuminated area (area illuminated by exposure light IL on master reticle Ri) similar to the rectangular aperture of the blinds 111 on the circuit pattern area of the master reticle Ri. That is, the plane where the aperture of the blinds 111 is arranged becomes substantially conjugate with the pattern formation surface of the master reticle Ri due to the combined system of the condenser mirror system 113, imaging lens system 114, and main condenser lens system 116.

Note that in the present embodiment, at least one of the condenser mirror system 113, imaging lens system 114, and main condenser lens system 116 is configured to be movable so as to enable change of the optical characteristics (focus position, aberration, etc.) of the illumination optical system 1, in particular the parts arranged between the density filter Fj, and the master reticle Ri. The optical characteristics are controlled (adjusted) under the control of the main control system 9. The optical characteristics of at least part of the illumination optical system 1, that is, the optical systems 112 to 116 (corresponding to the later explained optical members) are made variable (adjustable) so as to correct a change in the width of the image on the substrate 4 of the light-attenuating part 123 of the density filter Fj on the master reticle Ri occurring due to a change in the illumination conditions of the master reticle Ri due to the illumination system 1 (that is, the above-mentioned aperture stop system 107 or optical unit) and in turn a change in the widths of the overlay parts on the substrate 4.

In this way, in the present embodiment, to correct a change in the image of the light-attenuating part 123, the filter stage FS is configured to be movable in the Z-direction and the optical characteristics of the condenser lens system 113 etc. are configured to be variable. To correct a change in the width of image of the light-attenuating part 123 of the density filter Fj, it is also possible to just control the position of the density filter Fj in the Z-direction or just adjust the optical characteristics of the condenser lens system 113 etc. Further, it is possible to combine control of the position of the density filter Fj in the Z-direction and adjustment of the optical characteristics of the condenser lens system 113 etc.

The exposure light IL emitted from the illumination optical system 1 illuminates a master reticle Ri held on the reticle stage 2. The reticle stage 2 holds the i-th (i=1 to N) master reticle Ri. A shelf-like reticle library 16b is arranged at the side of the reticle stage 2. This reticle library 16b has N number (N is a natural number) of support shelves 17b successively arranged in the Z-direction. Master reticles R1, . . . , RN are carried on the support shelves 17b.

The reticle library 16b is supported to be movable in the Z-direction by a slider 18b. A loader 19b able to freely rotate and provided with an arm able to move in a predetermined range in the Z-direction is arranged between the reticle stage 2 and the reticle library 16b. The main control system 9 adjusts the position of the reticle library 16b in the Z-direction through the slider 18b, then controls the operation of the loader 19b to enable transfer of desired master reticles F1 to FL between the desired support shelves 17b of the reticle library 16b and the reticle stage 2.

The image of the patterns in the illuminated area of the master reticle Ri is projected on the surface of the substrate for the working reticle (blank) 4 at a reduction rate $1/\alpha$ ($\alpha$ is for example 5, 4, etc.) through a projection optical system 3.

The reticle stage 2 moves the held master reticle Ri in the XY plane in the rotational direction and the translational direction. The reticle stage 2 is provided with not shown laser interferometers. These laser interferometers are used to measure the X-coordinate, Y-coordinate, and rotational angle of the reticle stage 2. The measured values and control information from the main control system 9 are used for control of the operation of the reticle stage 2. Further, the reticle stage 2 is configured to be movable in the optical axis AX direction of the projection optical system 3 and is configured to enable change of the angle with respect to the optical axis AX. Due to this, it is possible to adjust the position and posture of the master reticle Ri in the Z-direction. These operations are controlled by the control information from the main control system 9.

On the other hand, the substrate 4 serving as the sensitive object is prevented from positional deviation due to deformation of the substrate by being placed on a holder comprised of three pins without suction or with soft suction. The substrate holder is affixed on the sample table 5. The sample table 5 is affixed on the substrate stage 6. Note that as the substrate holder, it is also possible to use a pin chuck holder etc. to hold the substrate 4. The sample table 5 matches the surface of the substrate 4 with the imaging plane of the projection optical system 3 by control of the focal position (position in optical axis AX direction) and angle of tilt of the substrate 4 by an auto focus system. The sample table 5 has affixed to it an illumination profile detection sensor (so-called illumination uniformity sensor) for detecting the illumination profile of the exposure light IL on a positioning use fiducial mark member 12 and substrate 4. Further, the substrate stage 6 moves and positions the sample table 5 (substrate 4) in the X-direction and Y-direction on the base 7 by for example linear motors.

Above the sample table 5 are fixed movable mirrors 8m. The movable mirrors 8m are provided with laser interferometers 8 facing them. Note that in FIG. 1, while the illustration is simplified, the movable mirrors 8m include a movable mirror extending in the X-direction and a movable mirror extending in the Y-direction above the sample table 5 and each of these-movable mirrors-is-provided with a laser interferometer facing it. The laser interferometers 8 are used to measure the X-coordinate, Y-coordinate, and rotational angle of the sample table 5. The measured values are supplied to a stage control system 10 and main control system 9. The stage control system 10 controls the operation of the linear motors etc. of the substrate stage 6 based on the measured values and the control information from the main control system 9. Further, while the illustration is omitted in FIG. 1, the measurement results from the laser interferometer provided at the reticle stage 2 are supplied to the main control system 9. In accordance with the measurement results, the main control system 9 controls the X-coordinate, Y-coordinate, rotational angle, Z-coordinate, and angle with respect to the optical axis AX of the reticle stage 2. Note that instead of the movable mirrors, it is also possible to use reflecting surfaces formed by polishing the end faces (side faces) of the sample table 5 to a mirror finish.

Next, the details of the illumination profile detection sensor 126 will be explained. FIG. 4A and FIG. 4B are views of the configuration of the illumination profile detection sensor 126. The illumination profile detection sensor 126 is for measuring the spatial profile of the exposure light IL, that is, the profile of intensity (illumination profile) of the exposure light, by making the substrate stage 6 move in the plane horizontal to the substrate 4 in a state illuminated by the exposure light IL through the projection optical system 3. As shown in FIG. 4A, the illumination profile detection sensor 126 is comprised of a light-blocking plate 55 having a rectangular (in the present embodiment, square) aperture (or pinhole) 54 below which a photoelectric sensor 56 is provided. The detection signal of the photoelectric sensor 56 is output to the main control system 9. Further, it is also possible to not provide the photoelectric sensor 56 below the aperture 54, but to guide light by a light guide etc. and detect the amount of received light by a photoelectric sensor etc. at another portion.

The light-blocking plate 55 is normally comprised of a quartz or other substrate on which chrome (Cr) or other metal is deposited, but if depositing chrome or another metal, the reflectance of the exposure light on the light-blocking plate 55 is high and the amount of reflection of the exposure light is great. As a result, flares occur due to the reflected light of the light-blocking plate 55 being reflected by the projection optical system or reticle. The illumination profile detection sensor 126 is provided for measuring the illumination profile of the exposure light when the substrate 4 is exposed. It is most preferable to measure the illumination profile of the exposure light at the time of actual exposure. However, when measuring the illumination profile of exposure light, if the situation differs from the situation at the time of actual exposure, that is, if the situation is one in which the amount of reflection of the exposure light becomes greater, it is not possible to accurately measure the illumination profile of the exposure light at the time of actual exposure.

Therefore, in the present embodiment, to make measurement as close as possible to the actual illumination profile of the exposure light at the time of exposure, the reflectance on the top surface of the light-blocking plate 55 is made substantially the same extent as the reflectance of the substrate 4 so as to reduce the effect due to the reflected light. The top surface of the light-blocking plate 44 is formed with a film having a reflectance of the same extent as the reflectance of the substrate 4 in the wavelength band of the exposure light. To realize this film, for example, as shown in FIG. 4B, it is possible to deposit on the quartz transparent substrate 57 chrome 58, form on the chrome 58 a thin film 59 of chrome oxide, and coat above this a photoresist 60 the same as the photoresist coated on the substrate 4 to the same thickness. The reflectance of the top surface of this light-blocking plate 55 can be adjusted by suitably selecting not only the material of the film formed on the surface, but also the thickness and configuration (number of layers, layer thicknesses, materials of layers, etc.) When the substrate 4 is formed with an antireflection film etc., the reflectance of the top surface of the light-blocking plate 55 is set considering all of the conditions as well.

By using such an illumination profile detection sensor 126 to measure the exposure light passing through the aperture 54 formed in the light-blocking plate 55 while making the substrate stage 6 move in a plane horizontal to the surface of the substrate 4, it is possible to measure an illumination profile substantially the same as the illumination profile of the exposure light at the time of actual exposure.

Further, the main control system 9 has connected to it a storage device 11 such as a magnetic disk drive. The storage device 11 stores an exposure data file. The exposure data file records design information of the master reticles R1 to RN, the positional relationship among the master reticles R1 to RN, the correspondence of the density filters F1 to FL to the master reticles R1 to RN, the alignment information, etc.

The exposure apparatus according to the present invention uses a plurality of master reticles to expose a plurality of shot areas with peripheral parts partially overlapping on the substrate. That is, it performs stitch exposure of shots. This exposure apparatus is used not only when producing a semiconductor integrated circuit, but also when producing a reticle. Further, it is also possible to perform stitch exposure at a single shot area using a plurality of patterns. Here, the explanation will be given of the method of producing a reticle produced using this master reticles Ri and this exposure apparatus, that is, the working reticle.

Figure 5:
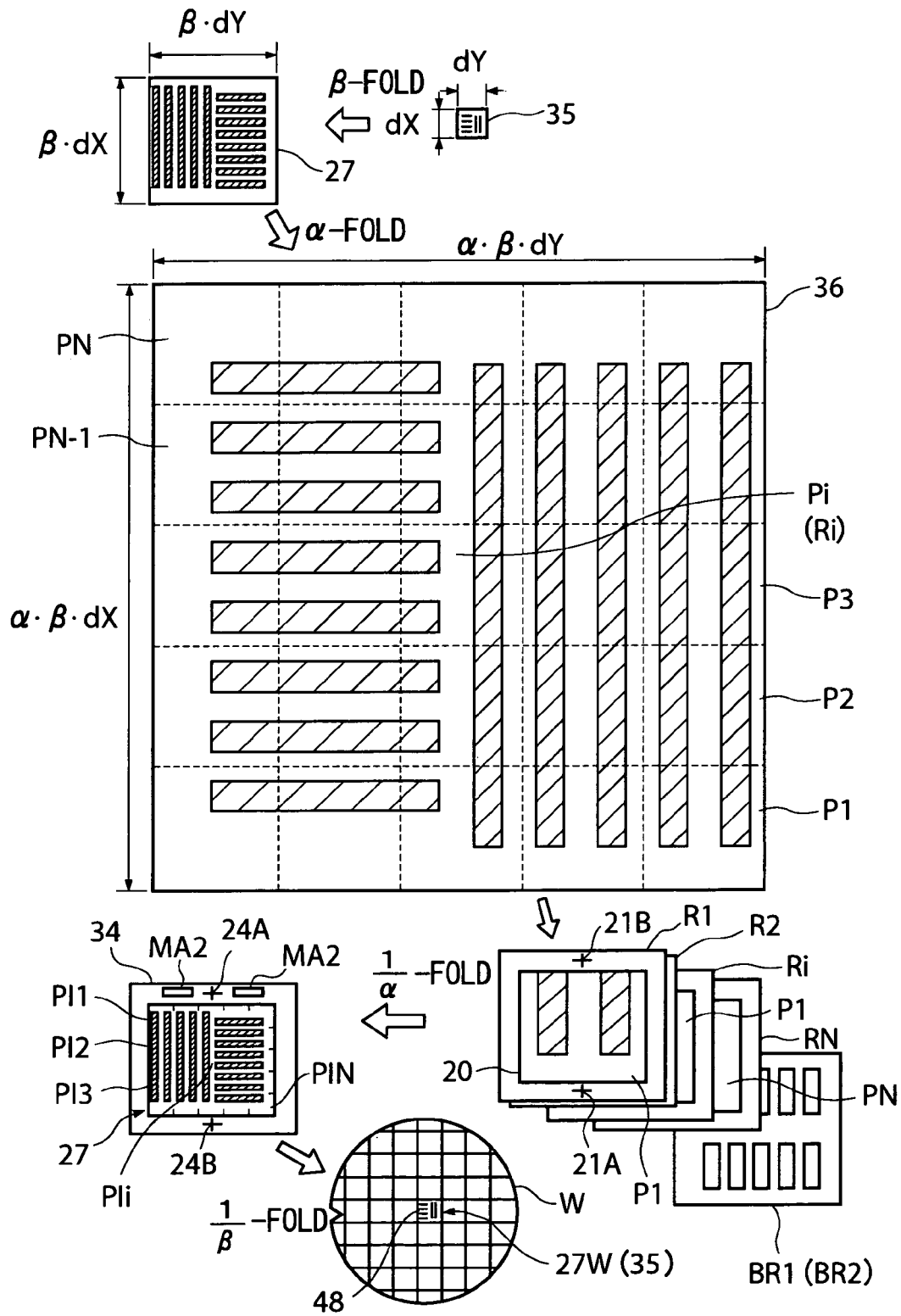
FIG. 5 is a view for explaining a process of production when producing a reticle (working reticle) using a master reticle.

FIG. 5 is a view for explaining the process of production when producing a reticle (working reticle) using master reticles Ri. The working reticle 34 shown in FIG. 5 is the finally produced reticle. The working reticle 34 is comprised of a light-transmitting substrate made of quartz glass or the like (blank) on one surface of which is formed a master pattern 27 for transfer by chrome (Cr), molybdenum silicide ($MoSi_2$ etc.), or another mask material. Further, two alignment marks 24A and 24B are formed so as to straddle the master pattern 27.

The working reticle 34 is used in reduction projection of $1/\beta$ (where $\beta$ is an integer larger than 1 or a half integer etc., for example, 4, 5, or 6) through a projection optical system of an optical type projection exposure apparatus. That is, in FIG. 5, a reduced image 27W of $1/\beta$ times the master pattern 27 of the working reticle 34 is exposed on each shot area 48 of a wafer W coated with a photoresist, then developed or etched etc. to form a predetermined circuit pattern 35 on each shot area 48.

In FIG. 5, first the circuit pattern 35 of a certain layer of the semiconductor device to be finally produced is designed. The circuit pattern 35 forms various line-and-space patterns (or isolated patterns) in a rectangular area with widths of perpendicular sides of dX and dY. In this embodiment, the circuit pattern 35 is enlarged $\beta$ times to prepare a master pattern 27 comprised of a rectangular area with widths of perpendicular sides of $\beta \cdot dX$ and $\beta \cdot dY$ in the image data of the computer. The multiple $\beta$ is a reciprocal of the reduction rate $(1/\beta)$ of the projection exposure apparatus where the working reticle is to be used. Further, the image is inverted and enlarged at the time of inversion projection.

Next, the master pattern 27 is enlarged $\alpha$-fold ($\alpha$ is an integer larger than 1 or a half integer, for example, 4, 5, or 6) to prepare, in the image data, a parent pattern 36 comprised of a rectangular area with widths of perpendicular sides of $\alpha \cdot \beta \cdot dX$ and $\alpha \cdot \beta \cdot dY$. The parent pattern 36 is then partitioned longitudinally and laterally into $\alpha$ number of sections to prepare $\alpha \times \alpha$ number of parent patterns P1, P2, P3 . . . , PN ($N=\alpha^2$) in the image data. In FIG. 5, the case where $\alpha=5$ is shown. Note that the multiple $\alpha$ is the reciprocal of the projection magnification of the projection exposure apparatus used for production of the working reticle 34 (in this example, the magnification of the projection optical system 3 in FIG. 1). Further, the divisor $\alpha$ of the parent pattern 36 does not necessarily have to match the magnification $\alpha$ of the master pattern 27 to the parent pattern 36. The number of partitions in the vertical and horizontal directions do not have to be made the same either. Next, these parent patterns Pi (i=1 to N) are used to produce lithographic data for an electron beam lithography system (or laser beam lithography system) and these parent patterns Pi are transferred on to the master reticle Ri as parent masks at equal magnification rates.

For example, when producing one master reticle R1, a thin film of chrome or molybdenum silicide or other mask material is formed on a light-transmitting substrate of quartz glass etc., an electron beam resist is coated on this, then the electron beam lithography system is used to draw an equal magnification latent image of the first parent pattern P1 on the electron beam resist. Next, the electron beam resist is developed, then is etched and the resist peeled off etc. to form the parent pattern P1 on the pattern area 20 on the master reticle R1.

Further, the master reticle R1 is formed with alignment marks 21A and 21B comprised of 2-dimensional marks in a predetermined positional relationship with respect to the parent pattern P1. In the same way, an electron beam lithography system is used to form parent patterns Pi and alignment marks 21A and 21B on other master reticles Ri. These alignment marks 21A and 21B are used for positioning with respect to the substrate or density filter.

The parent patterns Pi drawn by the electron beam lithography system (or laser beam lithography system) in this way are patterns of the master pattern 27 enlarged α-times, so the amount of the lithographic data is reduced to about $1/\alpha^2$ compared with when directly drawing the master pattern 27. Further, the minimum line width of the parent patterns Pi is α-times (for example 5-times or 4-times) the minimum line width of the master pattern 27, so the parent patterns Pi can be drawn in a short time and at a high accuracy by an electron beam lithography system using conventional electron beam resists. Further, by producing N number of master reticles R1 to RN at one time, it is possible to produce the number of necessary working reticles 34 by repeatedly using them, so the time for producing the master reticles R1 to RN does not become a large burden.

The working reticle 34 is produced by using the thus produced N number of master reticles Ri and transferring the 1/α-size reduced images of the parent patterns Pi of the master reticles Ri while stitching them together.

When producing a working reticle 34 explained above, for example to improve the OPE characteristic explained above, the illumination σ and other illumination conditions are set in accordance with the density of the patterns etc. formed on the master reticles Ri. When changing the illumination σ and other illumination conditions, a change in the width of the light-attenuating part 123 of the density filter Fj at the master reticles Ri and in turn a change in the widths of the overlay parts on the substrate 4 occur as explained above. Below, the method of correction of the change in the widths will be explained in detail.

Figure 6:
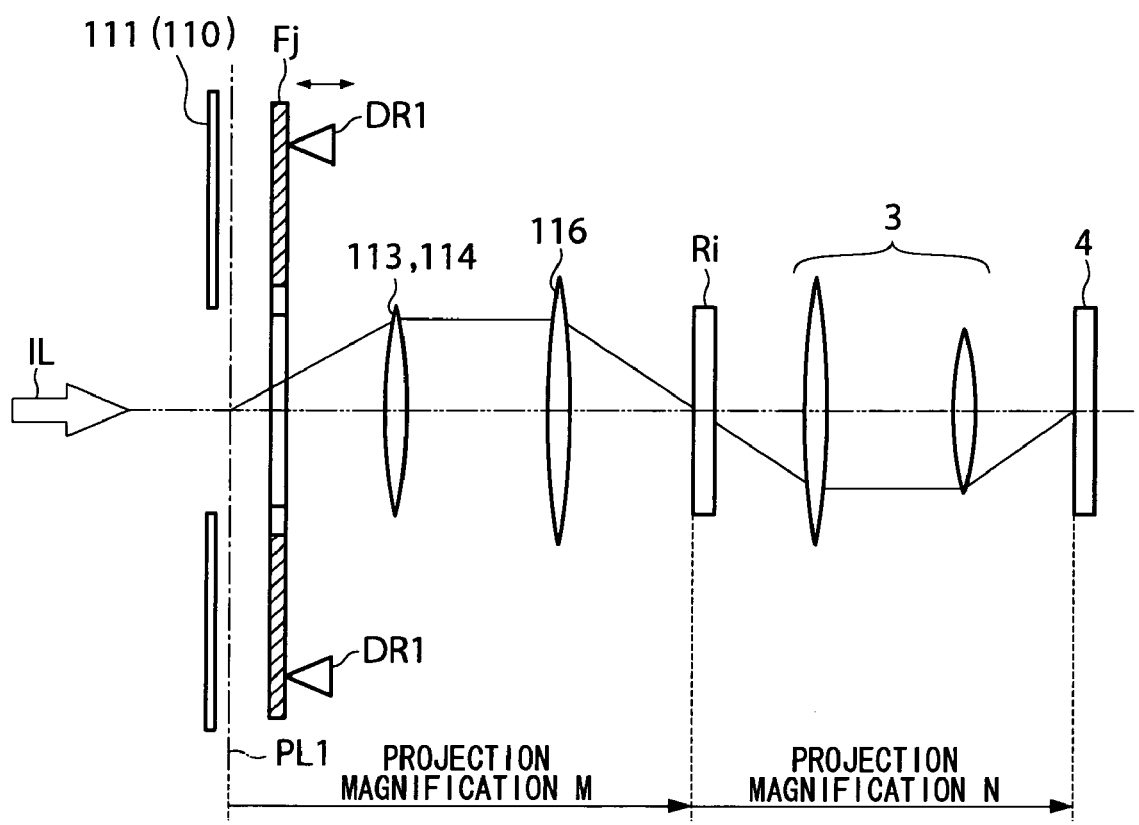
FIG. 6 is a view of the arrangement of optical members from the blinds to the substrate in FIG. 1.
Figure 7:
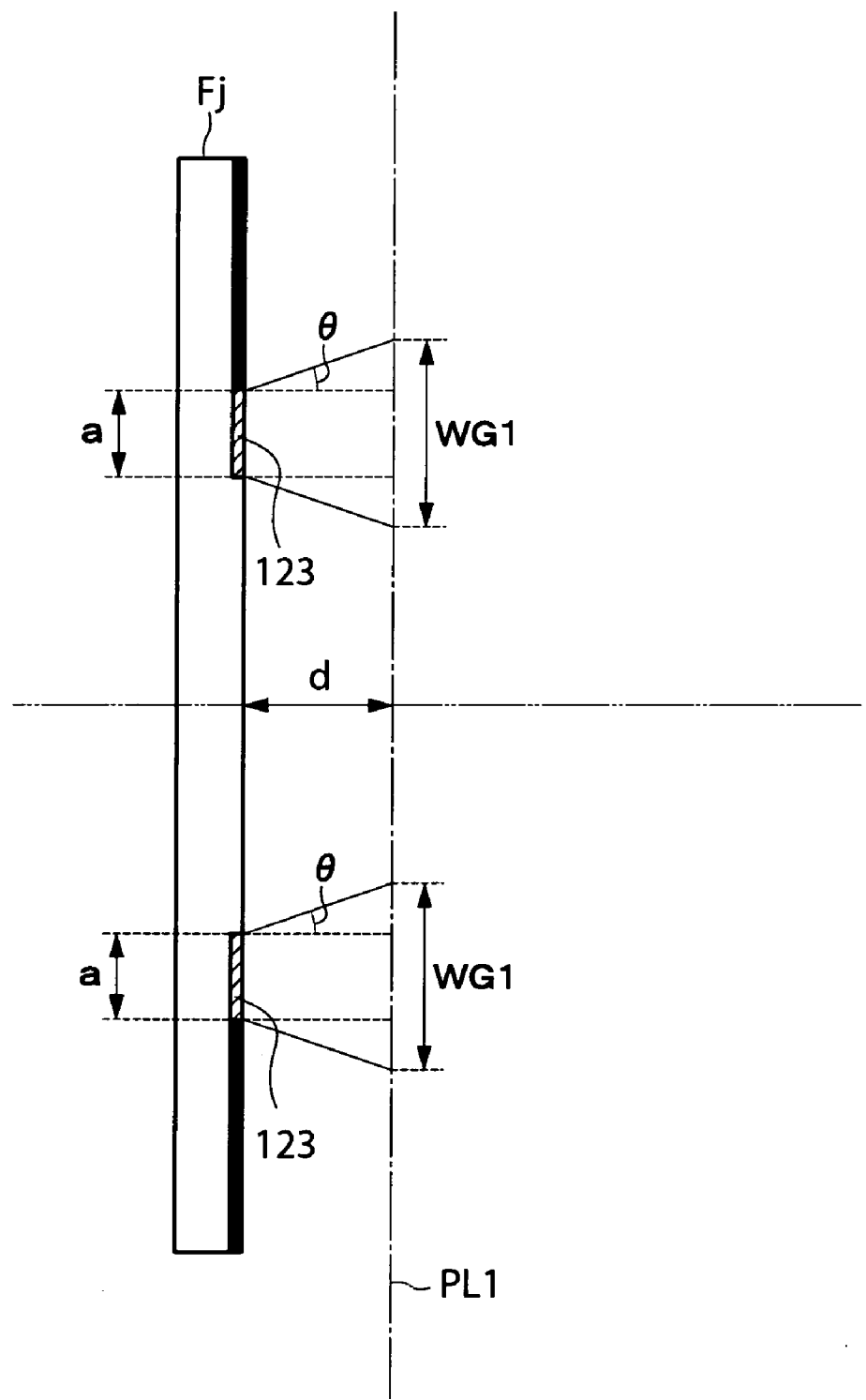
FIG. 7 is a view of changes in the width of the image of a light-attenuating part of a density filter when changing the illumination σ and other illumination conditions.

FIG. 6 is a view of the optical members arranged in the optical path from the blinds 111 to the substrate 4 in FIG. 1, while FIG. 7 is a view of the change in the width of the light-attenuating part 123 of a density filter Fj when changing the illumination σ and other illumination conditions.

As shown in FIG. 6, the blinds 111 and the density filter Fj are arranged near a plane PL1 conjugate with the master reticle Ri (hereinafter referred to as the "reticle conjugate plane PL1"). The projection magnification of the optical members between this reticle conjugate plane PL1 and master reticle Ri (condenser lens system 113, imaging lens system 114, and main condenser lens system 116) is designated as M and the projection magnification of the projection optical system 3 arranged between the master reticle Ri and the substrate 4 is designated as N (=1/α) Note that in the following explanation, it is assumed that the optical members (optical system) are enlargement types, M=2, N=¼, and the numerical aperture of the projection optical system 3 is 0.75.

Further, as shown in FIG. 7, the width of the light-attenuating part 123 is designated as [a] and the amount of defocus of the density filter Fj from the reticle conjugate plane PL1 is designated as [d]. Here, if designating the incident angle of the exposure light IL as θ, the numerical aperture NA1 of the exposure light IL at the reticle conjugate plane PL1, the numerical aperture NA2 of the exposure light IL at the position of the master reticle Ri, and the numerical aperture NA3 of the exposure light IL at the position of the substrate 4 are expressed by the following equation (1) to equation (3):

$$NA1 = \sin\theta \qquad (1)$$

$$NA2 = \sin\theta/M \qquad (2)$$

$$NA3 = \sin\theta/(M\cdot N) \qquad (3)$$

Further, since the density filter Fj is defocused with respect to the reticle conjugate plane PL1, the width WG1 of the light-attenuating part 123 at the reticle conjugate plane PL1, the width WG2 of the light-attenuating part 123 at the position of the master reticle Ri, and the width WG3 of the image of the light-attenuating part 123 at the position of the substrate 4 become the following equation (4) to equation (6):

$$WG1 = a + 2\cdot d\cdot\tan\theta + b \qquad (4)$$

$$WG2 = (a + 2\cdot d\cdot\tan\theta + b)\cdot M \qquad (5)$$

$$WG3 = (a + 2\cdot d\cdot\tan\theta + b)\cdot MN \qquad (6)$$

Note that in equation (4) to equation (6), [b] is the amount of blurring occurring due to aberration etc. of the illumination optical system 1.

Here, as shown in FIG. 14, when transferring patterns of a pattern size of 360 nm on the substrate 4, the OPE characteristic was the best when setting the illumination σ to 0.55, that is, when the numerical aperture NA of the exposure light IL on the substrate 4 is 0.75×0.55=0.413. At this time, the incident angle of the exposure light IL irradiating the substrate 4 is found as follows from equation (3):

$$\sin\theta = NA3 \cdot M \cdot N$$
$$= 0.75 \times 0.55 \times 2 \times (1/4)$$
$$= 0.206$$
$$\theta = 11.9 \text{ degrees}$$

Further, to make the width WG of the light-attenuating part 123 at the position of the substrate for example 1000 μm (1 mm), from equation (6), it is sufficient to set the width [a] of the light-attenuating part 123, the amount of defocus [d] of the density filter Fj from the reticle conjugate plane PL1 and the amount of blurring [b] occurring due to the aberration of the illumination optical system 1 etc. as follows for example.

a=1368 μm d=1500 μm b=0 μm

Figure 15:
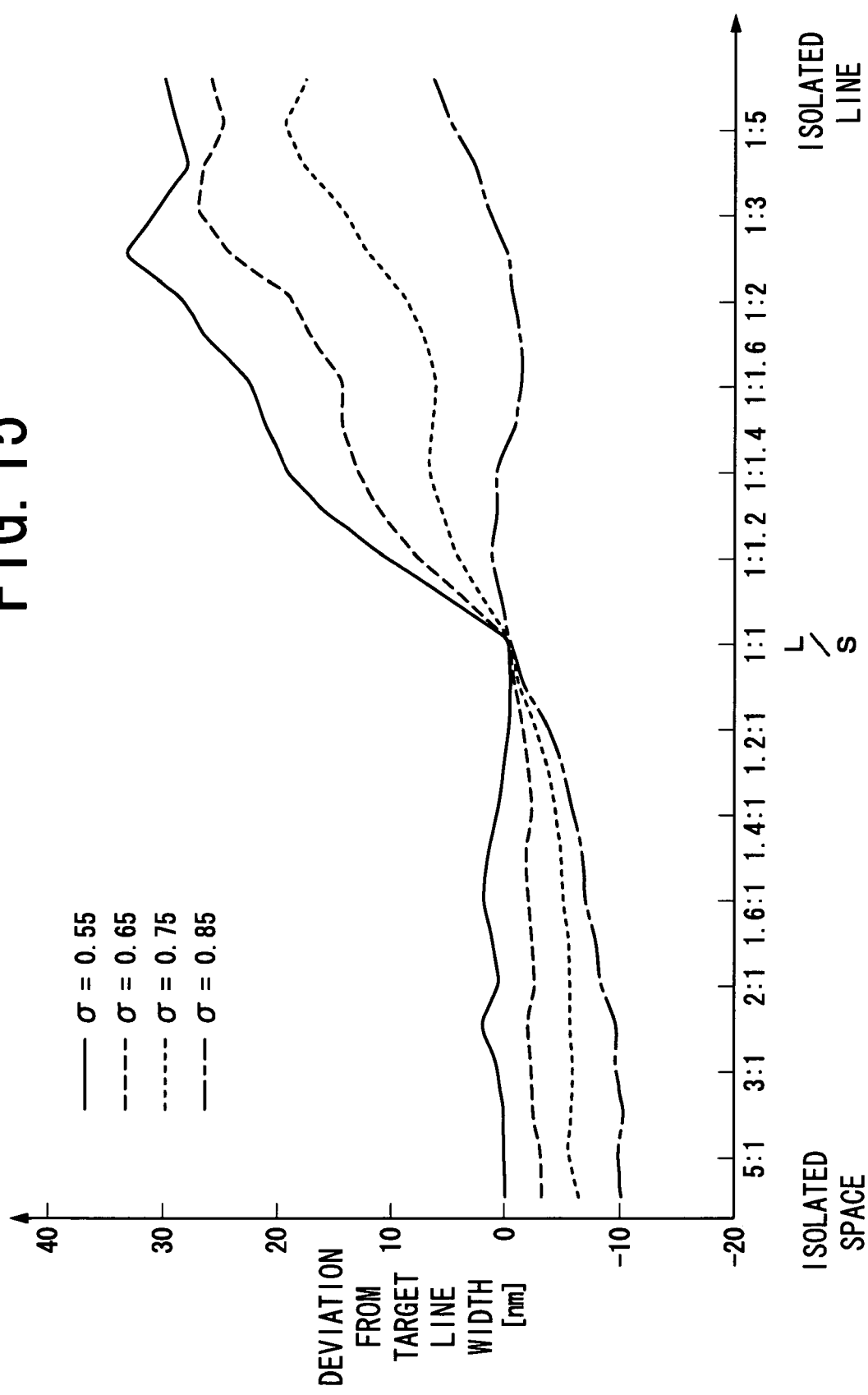
FIG. 15 is a view of the OPE characteristic when changing the density of patterns with a pattern size of 200 nm and the illumination σ.
Figure 16:
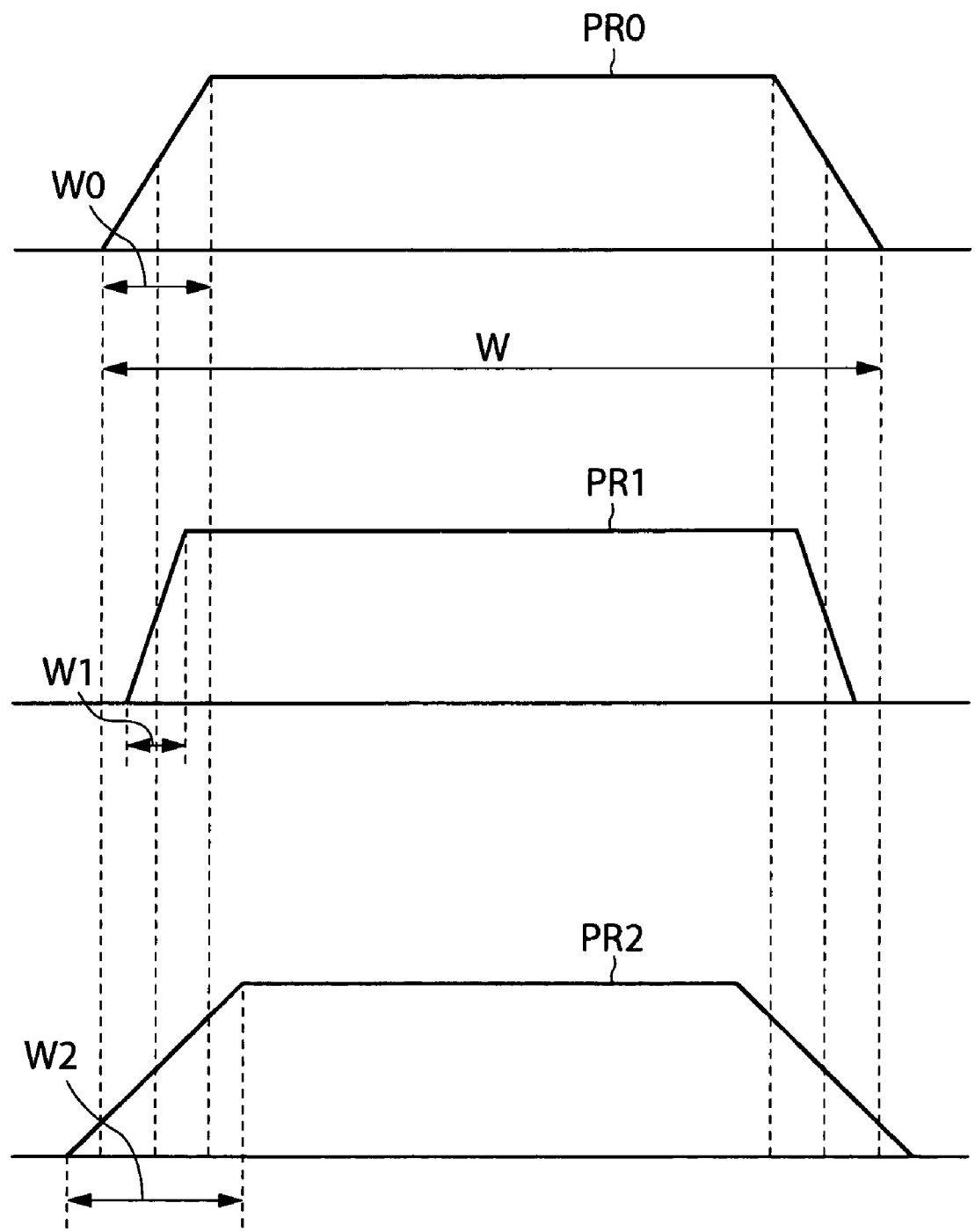
FIG. 16 is a view of the change in the profile of exposure when changing the illumination σ.
Figure 17:
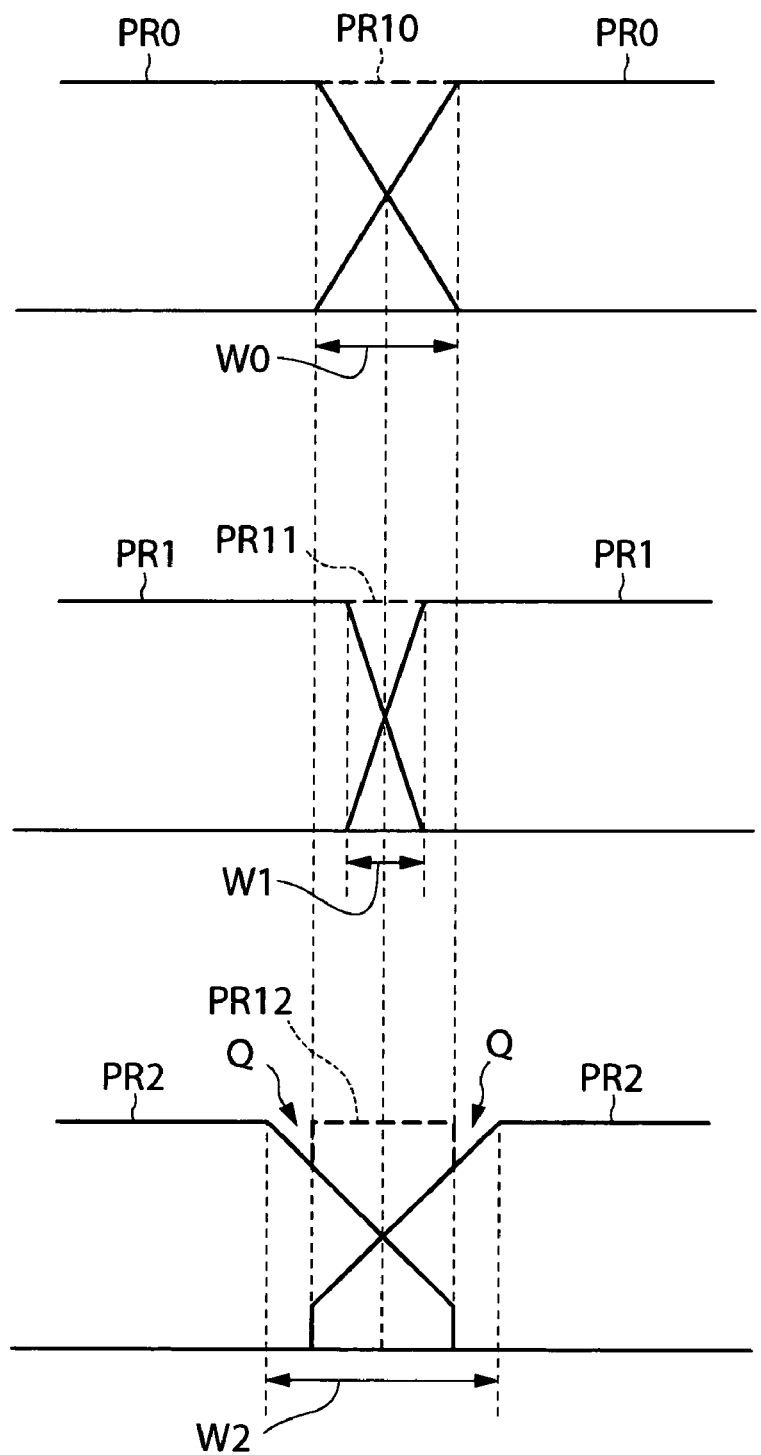
FIG. 17 is a view of an amount of exposure at overlay parts when changing the illumination σ.

Here, when transferring patterns with a pattern size of 200 nm instead of patterns with a pattern size of 360 nm on the substrate 4, the OPE characteristic was the best when setting the illumination σ at 0.85 as explained using FIG. 15, that is, when the numerical aperture NA3 of the exposure light IL on the substrate 4 is 0.75×0.85=0.638. At this time, the incident angle of the exposure light IL irradiating the substrate 4 is found as follows from equation (3):

$$\sin\theta = NA3 \cdot M \cdot N$$
$$= 0.75 \times 0.85 \times 2 \times (1/4)$$
$$= 0.319$$
$$\theta = 18.6 \text{ degrees}$$

In the past, when changing the illumination conditions (in this example, the illumination σ, that is, the coherence factor), the amount of defocus [d] of the density filter Fj with respect to the reticle conjugate plane PL1 was not changed, so if changing the illumination σ from 0.55 to 0.85, from equation (6), the width WG3 of the image of the light-attenuating part 123 at the position of the substrate ended up increasing to 1189 μm.

Here, referring to equation (6), the width WG3 of the image of the light-attenuating part 123 at the position of the substrate 4 is determined by the width [a] of the light-attenuating part 123, the amount of defocus [d] of the density filter Fj from the reticle conjugate plane PL1, the incident angle θ of the exposure light IL, the amount of blurring [b] occurring due to aberration of the illumination optical system 1, the enlargement magnification M of the optical members between the reticle conjugate plane PL1 and the master reticle Ri, and the reduction rate N of the projection optical system 3. Therefore, by making at least one of these six parameters variable, it becomes possible to adjust the width WG3 of the image of the light-attenuating part 123 at the position of the substrate 4. In the present embodiment, by controlling the amount of defocus [d] of the density filter Fj from the reticle conjugate plane PL1, which is easy to make variable by the drive mechanism DR1 (see FIG. 6) among these parameters, the width WG3 of the image of the light-attenuating part 123 at the position of the substrate 4 is adjusted.

Specifically, if modifying equation (6), the following equation (7) is obtained:

$$d = (WG3/(M \cdot N) - a - b)/(2 \cdot \tan\theta) \quad (7)$$

In equation (7), if making WG3 1000 μm and making θ 18.6 degrees, [d] becomes 940 μm. Therefore, when changing the illumination σ which had been set to 0.55 to transfer patterns of a pattern size of 360 nm on a substrate 4 to 0.85, it is sufficient to change the amount of defocus of the density filter Fj with respect to the reticle conjugate plane PL1 from 1500 μm to 940 μm. In this way, in the present embodiment, by changing the illumination conditions (for example, illumination σ) of the master reticle Ri by the illumination optical system 1 so as to give the optimal OPE characteristic in accordance with the size and density of patterns formed at a master reticle Ri and adjusting the position of the density filter Fj in the Z-direction, the patterns of a master reticle Ri are transferred on the substrate 4 while adjusting the width WG3 of the image of the light-attenuating part 123 of the density filter Fj on the substrate 4. Note that the main control system 9 preferably sets the optimal illumination conditions for each pattern to be transferred on the substrate 4 by the aperture stop system 107 or optical unit and adjusts the position of the density filter Fj in the Z-direction based on the design information of the master reticles R1 to RN stored in the exposure data file in the storage device 11. Further, it is also possible to find in advance the illumination conditions of the illumination optical system 1 set for each of the master reticles R1 to RN and the amount of defocus [d] of the density filter Fj with respect to the reticle conjugate plane PL1 and store the actually measured values (or calculated values) in the storage device 11 linked with the master reticles R1 to RN.

Further, when exposing reduced images of the master reticles R1 to RN on the substrate 4 by projection in this way, it is necessary to stitch the adjoining reduced images with a high accuracy. For this alignment, the projection exposure apparatus of the present embodiment is provided with a reticle and substrate alignment mechanism.

Figure 8:
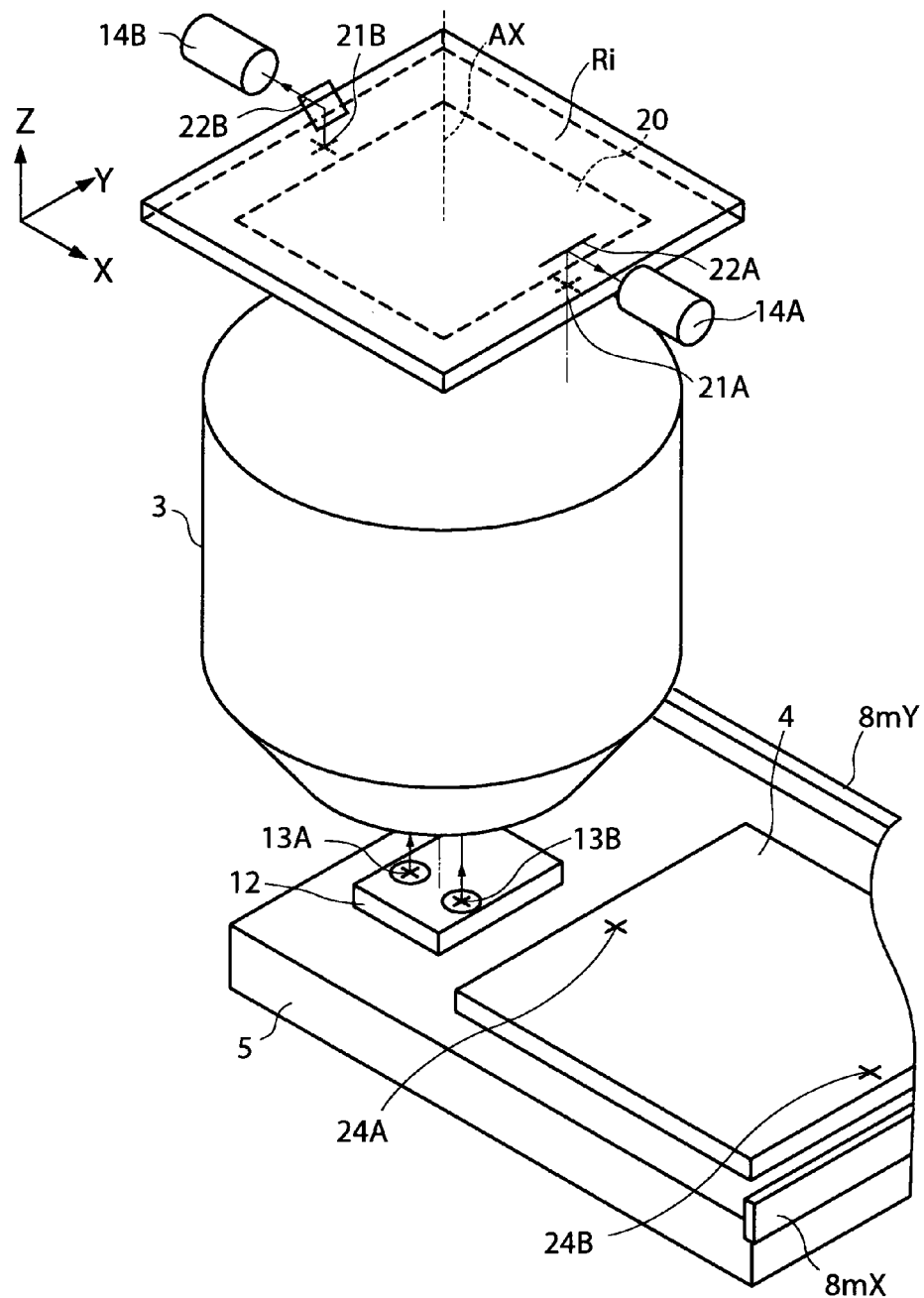
FIG. 8 is a view of an alignment mechanism of a reticle.

FIG. 8 shows the reticle alignment mechanism. In FIG. 8, a light-transmitting fiducial mark member 12 is affixed near the substrate 4 on the sample table 5. Two cross-shaped fiducial marks 13A and 13B are for example formed at a predetermined interval in the X-direction on the fiducial mark member 12. At the bottoms of the fiducial marks 13A and 13B is placed an illumination system for illuminating the fiducial marks 13A and 13B at the projection optical system 3 side by illumination light branched from the exposure light IL. When aligning a master reticle Ri, the substrate stage 6 of FIG. 1 is driven to position the fiducial marks 13A and 13B so that the center point between the fiducial marks 13A and 13B on the fiducial mark member 12 substantially registers with the optical axis AX of the projection optical system 3 as shown in FIG. 8.

Further, for example, two cross-shaped alignment marks 21A and 21B are formed so as to straddle the pattern area 20 of the pattern surface (bottom surface) of the master reticle Ri in the X-direction. The distance between the fiducial marks 13A and 13B is set to be substantially equal to the distance between images of the alignment marks 21A and 21B reduced by the projection optical system 3. By illumination by illumination light of the same wavelength as the exposure light IL from the bottom of the fiducial mark member 12 in the state with the center point between the fiducial marks 13A and 13B substantially in register with the optical axis AX in the above way, images of the fiducial marks 13A and 13B enlarged by the projection optical system 3 are formed near the alignment marks 21A and 21B of the master reticle Ri.

Mirrors 22A and 22B are arranged above the alignment marks 21A and 21B to reflect the illumination light from the projection optical system 3 side in the ±X directions. Image processing type alignment sensors 14A and 14B are provided by a TTR (through-the-reticle) system so as to receive the illumination light reflected by the mirrors 22A and 22B. The alignment sensors 14A and 14B are each provided with an imaging system and a 2-dimensional image pickup element such as a CCD camera. The image pickup elements pick up the images of the alignment marks 21A and 21B and the corresponding fiducial marks 13A and 13B and supply image signals to an alignment signal processing system 15 of FIG. 1.

The alignment signal processing system 15 processes the image signals to find the amounts of positional deviation of the alignment marks 21A and 21B in the X-direction and Y-direction with respect to the fiducial marks 13A and 13B and supplies the two positional deviations to the main control system 9. The main control system 9 positions the reticle stage 2 so that the two positional deviations become symmetrical and within predetermined ranges. Due to this, the alignment marks 21A and 21B and in turn the master reticle Ri are positioned with respect to the fiducial marks 13A and 13B.

In other words, the center (exposure center) of the reduced image of the master reticle Ri obtained by the projection optical system 3 is substantially positioned at the center point between the fiducial marks 13A and 13B (substantially the optical axis AX). In this state, the main control system 9 of FIG. 1 stores the X-direction and Y-direction coordinates ($XF_0$, $YF_0$) of the sample table 5 measured by the laser interferometers 8, whereby the alignment operation of the master reticle Ri ends. After this, it is possible to move any point on the sample table 5 to the exposure center of the parent pattern Pi.

Further, as shown in FIG. 1, an image processing type alignment sensor 23 is provided by an off-axis system at the side of the projection optical system 3 to detect the position of a mark on the substrate 4. The alignment sensor 23 illuminates a detection mark by illumination light of a wide band to which the photoresist is not sensitive, picks up the image of the detection mark by a two-dimensional image pickup element such as a CCD camera, and supplies an image signal to the alignment signal processing system 15. Further, the distance (base line amount) between the detection center of the alignment center 23 and the center of the projected image of the pattern of the master reticle Ri (exposure center) is found in advance using a predetermined fiducial mark on the fiducial mark member 12 and stored in the main control system 9.

As shown in FIG. 8, two cross-shaped alignment marks 24A and 24B are formed at the ends of the substrate 4 in the X-direction. After a master reticle Ri is aligned, the substrate stage 6 is driven to successively move the fiducial marks 13A and 13B and the alignment marks 24A and 24B on the substrate 4 to the detection area of the alignment sensor 23 of FIG. 1 and measure the positional deviations of the fiducial marks 13A and 13B and the alignment marks 24A and 24B with respect to the detection center of the alignment sensor 23. The results of the measurements are supplied to the main control system 9. Using these measurement results, the main control system 9 finds the coordinates ($XP_0$, $YP_0$) of the sample table 5 when the center point between the fiducial marks 13A and 13B is in register with the detection center of the alignment sensor 23 and the coordinates ($XP_1$, $YP_1$) of the sample table 5 when the center point between the alignment marks 24A and 24B is in register with the detection sensor of the alignment sensor 23. This ends the alignment operation of the substrate 4.

As a result, the distances between the center point between the fiducial marks 13A and 13B and the center point between the alignment marks 24A and 24B in the X-direction and the Y-direction become ($XP_0$-$XP_1$, $YP_0$-$YP_1$). Therefore, by driving the substrate stage 6 of FIG. 1 by exactly the distances ($XP_0$-$XP_1$, $YP_0$-$YP_1$) with respect to the coordinates ($XF_0$, $YF_0$) of the sample table 5 at the time of alignment of the master reticle Ri, it is possible to bring the center point between the alignment marks 24A and 24B of the substrate 4 (center of substrate 4) into register with the center point between the projected images of the alignment marks 21A and 21B of the master reticle Ri (exposure center) with a high accuracy. From this state, the substrate stage 6 of FIG. 1 may be driven to move the sample table 5 in the X-direction and the Y-direction so as to expose a reduced image PIi of a parent pattern Pi of the master reticle Ri at a desired position with respect to the center of the substrate 4.

Further, when exposing one substrate 4, regardless of the change of the master reticle Ri, the substrate 4 is placed, without suction or with soft suction, on the sample table 5 comprised of the three pins, and the substrate stage 6 is made to move by a super-low acceleration and a super-low speed so that the position of the substrate 4 does not shift at the time of exposure. Therefore, since the positional relationship between the fiducial marks 13A and 13B and the substrate 4 does not change during the exposure of one substrate 4, when switching the master reticle Ri, it is sufficient to position the master reticle Ri with respect to the fiducial marks 13A and 13B. There is no need to detect the positions of the alignment marks 24A and 24B on the substrate 4 for each master reticle.

Above, an explanation was given of the positioning of a master reticle Ri and the substrate 4, but the master reticle Ri and the density filter may also be positioned relative to each other based on the results of measurement of the positional information of the marks 124A, 124B, 124C, and 124D and the slit mark 125. At this time, a slight rotation sometimes occurs in the substrate 4 due to the characteristics of the substrate stage 6, the yawing error, and other error. Therefore, a slight deviation occurs in the relative postures of the master reticle Ri and the substrate 4. This error is measured in advance or measured during actual processing and the reticle stage 2 or substrate stage 6 controlled so that the postures of the master reticle Ri and the substrate 4 are corrected to become in register so as to cancel this error out.

By successively exposing reduced images of parent patterns P1 to PN of the N number of master reticles R1 to RN of FIG. 1 on the corresponding shot areas S1 to SN of the substrate 4 in this way, the reduced images of the parent patterns P1 to PN are exposed while being stitched with the reduced images of the adjoining parent patterns. Due to this, the projected image 26 of the parent pattern 36 of FIG. 1 reduced to $1/\alpha$ is exposed and transferred on to substrate 4 at the exposure area comprised of the plurality of shot areas with peripheral parts partially overlapped. Next, the photoresist on the substrate 4 is developed and etched and the remaining resist pattern is peeled off, whereby the projected image 26 on the substrate 4 forms the master pattern 27 as shown in FIG. 6 and the working reticle 34 is completed.

In the embodiment explained above, the illumination conditions of the illumination optical system 1 were changed in accordance with the pattern size and density of the patterns formed on a master reticle Ri and the position of the density filter Fj in the Z-direction (amount of defocus of the density filter Fj with respect to the reticle conjugate plane) was adjusted in accordance with the change in the illumination conditions to adjust the width of the image of the light-attenuating part 123 of the density filter Fj on the substrate 4, that is, the widths of the overlay parts, and successively transfer patterns of master reticles Ri on the substrate 4 by a step-and-repeat operation so as to produce a working reticle 34.

Here, if adjusting the defocus of the density filter Fj, sometimes deviation occurs between the combined amount of exposure at the overlay parts and the amount of exposure at other than the overlay parts. In this case, by controlling the relative positions of the blinds 111, density filter Fj, master reticle Ri, and substrate 4, it is possible to adjust the combined amount of exposure of the overlay parts. Below, an example of the method of adjustment will be explained.

FIG. 9A to FIG. 9C, FIG. 10A to FIG. 10C, FIG. 11A to FIG. 1C, and FIGS. 12A to 14C are views for explaining the method of adjustment of the profile of the amount of exposure. Note that in these figures, to facilitate understanding, only the blinds, density filter, and master reticle are illustrated. First, FIG. 9A to FIG. 9C will be explained.

FIG. 9A is a view of the relative positions of the density filter and the master reticle when exposing a first shot area, FIG. 9B is a view of the relative positions of the density filter and the master reticle when exposing a second shot area adjoining the first shot area, and FIG. 9C is a view of the profile of amount of exposure in areas exposed when exposed in the state shown in FIG. 9A and FIG. 9B.

In FIG. 9A to FIG. 9C, members the same as the members shown in FIG. 1 are assigned the same notations. That is, in FIG. 9A and FIG. 9B, F1 and F2 are density filters, 111A and 111B are blinds, and R1 and R2 are master reticles. Note that in FIG. 9A and FIG. 9B, the density filters F1 and F2, the blinds 111A and 111B, and the master reticles R1 and R2 are shown centered about the optical axis AX of the projection optical system 3. For facilitating understanding, the optical axis AX is shown straight without bending. Further, in FIG. 1, the blinds 111A and 111B, the density filter Fj, and the reticle Ri are arranged in that order along the optical axis AX, but in FIG. 9A and FIG. 9B, to facilitate understanding, the density filters F1 and F2 and the blinds 111A and 111B are shown switched in order of arrangement. Further, for the master reticles R1 and R2, to specify the positions of the patterns formed on the master reticles R1 and R2, numerals according to the positions shown in FIG. 9A to FIG. 9C are assigned. Note that when specifying the pattern positions, they are described below such as the pattern "1", pattern "2", etc.

First, the case of exposure of the first shot area will be explained with reference to FIG. 9A. In FIG. 9A, the exposure light IL incident upon the density filter F1 has a uniform profile of exposure in the plane vertical to the optical axis AX, but if incident on the density filter F1, light is attenuated at the light-attenuating part 123, so after passing through the density filter F1, the profile of exposure becomes that with the notation PF1. Note that when showing the profile of exposure at FIG. 9A to FIG. 9C, the axis showing the amount exposure is made a direction parallel to the optical axis AX.

The exposure light passing through the density filter F1 strikes the blinds 111A and 111B whereby it is formed into a predetermined shape. In the example shown in FIG. 9A, it is formed into a shape illuminating the pattern "1" to the pattern "11" formed on the master reticle R1. When the exposure light passing through the blinds 111A and 111B strikes the master reticle R1, an image reflecting the shapes of the patterns is emitted as shown by notation Im1. Note that the profile of exposure of the image Im1 becomes one given the notation PF11. That is, the exposure light passing through the light-transmitting part 122 has a constant profile of exposure, but the exposure light passing through the light-attenuating part 123 becomes a profile of exposure linearly attenuating from the pattern "7" to the pattern "11".

Further, FIG. 9B shows the case of exposure of the second shot area. As shown in FIG. 9B, after passing through the density filter F2, the profile of exposure becomes the one assigned the notation PF2. Note that in FIG. 9A and FIG. 9B, to facilitate understanding, the profile of exposure PF1 and the profile of exposure FP2 are shown as the same profiles.

The positions of the blinds 111A and 111B in the case of exposure of the second shot area different from the positions of the blinds 111A and 111B in the case of exposure of the first shot area. That is, the blinds 111A and 111B form the exposure light into a shape illuminating the pattern "7" to the pattern "17" of the master reticle R2.

When the exposure light passing through the blinds 111A and 111B strikes the master reticle R2, as shown by notation Im2, an image reflecting the shapes of the patterns is emitted. Note that the profile of exposure of the image Im2 becomes that assigned the notation PF12. That is, the exposure light passing through the light-transmitting part 122 is a constant profile of exposure, but the exposure light passing through the light-attenuating part 123 becomes a profile of exposure linearly attenuating from the pattern "1" to the pattern "7".

The image Im1 shown in FIG. 9A and the image Im2 shown in FIG. 9B are stitched in the positional relationship shown in FIG. 9C. That is, the images of the pattern "7" to the pattern "11" are overlapped and transferred by exposure to the overlay part. If exposed in this way, ideally as shown by the notation PF13 in FIG. 9C, the amount of exposure of the overlay part becomes equal to the amount of exposure of the parts other than the overlay part. Note that in FIG. 9C, the distance between the exposure position of the first shot area and the exposure position of the second shot area is called the "step pitch SP1". That is, the step pitch SP1 is the distance for moving the second shot area to the exposure position after exposure of the first shot area. In the examples shown in FIG. 9A to FIG. 9C, FIG. 10A to FIG. 10C, FIG. 11A to FIG. 11C, and FIG. 12A to FIG. 12C, the step pitch SP1 is set to 21 mm, that is, 21000 µm.

Note that in this embodiment, the "overlay part" means a part where the peripheral parts of the shot areas overlap on the substrate 4, a part where the images of the light-attenuating parts 123 of the density filters Fj overlap on the substrate 4, or a part where the images of the patterns of the master reticles overlap on the substrate 4. In the above explanation, these matched, so were not particularly differentiated. However, in the following explanation, these sometimes do not match, so when referring to simply an "overlay part", this shall be deemed to mean mainly a part where the peripheral parts of shot areas overlap on the substrate 4. To differentiate from this, a part where the images of the light-attenuating parts 123 of the density filters Fj overlap on the substrate 4 will be sometimes referred to as a "reduced light image overlap part" and a part where the images of the patterns of the master reticles overlap on the substrate 4 will be referred to as a "pattern image overlap part".

Next, the method of adjustment of the exposure profile will be explained with reference to FIG. 10A to FIG. 10C, FIG. 11A to FIG. 11C, and FIG. 12A to FIG. 12C. The method explained below is a method of adjusting the amount of exposure at an overlay part where peripheral parts of shots overlap by changing the profile of the energy beam defined by the density filter and the relative position with the patterns to be transferred. More specifically, it adjusts the amount of exposure at the overlay part by changing the relative positions of the density filters and master reticles to change the width of the reduced light image overlay part. In the following description, the explanation will be given taking as an example the case where the width of the overlay part and the reduced light image overlay part is 1 mm, that is, 1000 µm.

In this case, the point that if the width of the reduced image overlay part changes by 10 µm, the amount of exposure changes by a rate of 1% should be noted. That is, 100%/1000 µm=1%/10 µm. Note that in the explanation using FIG. 10A to FIG. 10C, FIG. 11A to FIG. 1C, and FIG. 12A to FIG. 12C, the master reticles R1 and R2 are made to move, but in this case the point that the substrate 4 also moves along with movement of the master reticles R1 and R2 should be noted. In this case, the amount of movement of the substrate 4 is 1/α times the amount of movement of the master reticles R1 and R1 (where α is the reduction rate of the projection optical system 3).

FIG. 10A to FIG. 10C are views of an example of the relative positional relationship among the density filters, blinds, and master reticles in the case of decreasing the width of the reduced exposure overlay part so as to decrease the amount of exposure of the overlay part. Note that in the following explanation, for convenience, the explanation will be made of the case of changing the positions of the blinds 111A and 111B and the master reticles R1 and R2 without changing the positions of the density filters F1 and F2 to change the relative positions of the density filters F1 and F2 and the master reticles R1 and R2, but it is also possible to change the positions of the density filters F1 and F2 to change the relative positions without making the master reticles R1 and R2 move.

If now desiring to decrease the amount of exposure at the overlay part by exactly 1%, it is sufficient to decrease the width of the overlay part by exactly 10 μm. Therefore, at the time of the exposure of the second shot area on the substrate 4, the substrate 4 is made to move in a step from the exposure position of the first shot area by exactly 21000 μm+10 μm=21010 μm.

Further, as will be understood from a comparison of FIG. 9A and FIG. 10A, the blind 111A and the master reticle R1 are moved in the D1 direction in FIG. 10A by exactly the amount of one pattern formed on the master reticle R1. Therefore, the pattern "1" of the master reticle R1 moves to the position of the pattern "2" of the master reticle R1 shown in FIG. 9A. Since the case of reducing the width of the overlay part by exactly 10 μm is being considered here, the amount of movement of the master reticle R1 should be made 5 μm converted to the amount on the substrate 4. That is, since the reduction rate of the projection optical system 3 is 1/α, it is sufficient to make the master reticle R1 move by exactly 5×α μm in a certain direction, that is, the D1 direction in FIG. 10A. In FIG. 10A, since only the blind 111A moves, the illuminated area for the master reticle R1 also becomes narrower compared with the case of FIG. 9A. As shown in FIG. 10A, in this case, the image Im3 of the pattern "1" to the pattern "10" is formed.

After exposure of the first shot area, as explained above, the substrate 4 is made to move by exactly 21010 μm to position the second shot area at the exposure position. Further, the blind 111B and the master reticle R2 are made to move from the position shown in FIG. 9B in the direction with the overlay part, that is, in the D2 direction in FIG. 10B, by exactly 5·α μm. As shown in FIG. 10B, in this case, the image Im4 of only the pattern "8" to the pattern "17" is formed.

The image Im3 shown in FIG. 10A and the image Im4 shown in FIG. 10B are stitched in the positional relationship shown in FIG. 10C. That is, the image from the pattern "8" to the pattern "10" is exposed at the overlay part. That is, by making the step pitch SP1 of the substrate 4 SP1+SP2=21000 μm+10 μm=21010 μm and performing exposure by making the master reticles R1 and R2 move in the D1 direction and D2 direction compared with the case shown in FIG. 9A to FIG. 9C, the amount of exposure at the overlay part is decreased. As shown in FIG. 10C, the profile of the amount of exposure at the overlay part becomes the profile PF23.

Figure 11A:
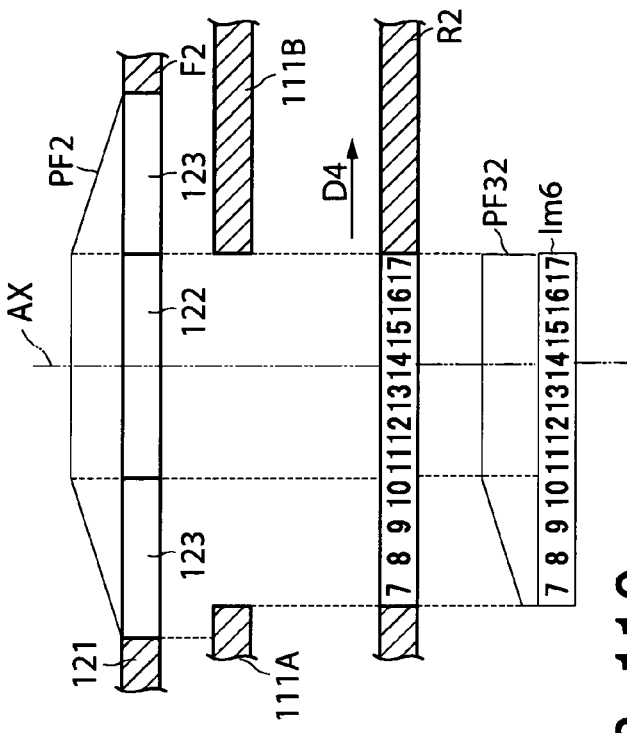
FIG. 11A to FIG. 11C are views for explaining a method of adjustment of the profile of exposure.
Figure 11B:
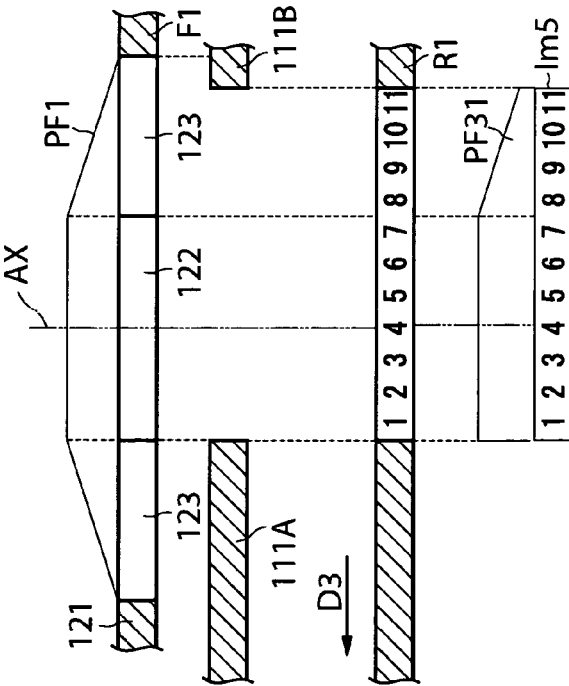
Figure 11C:
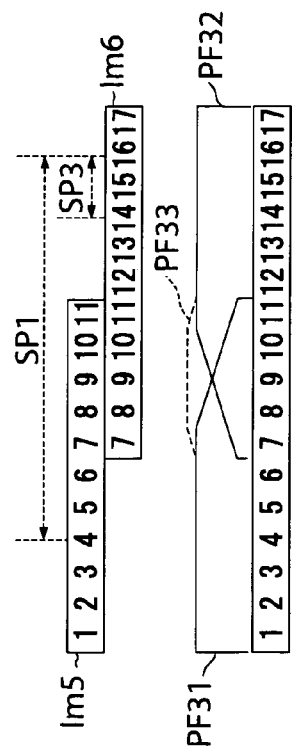

FIG. 11A to FIG. 11C are views of an example of the relative positional relationship among the density filters, blinds, and master reticles in the case of increasing the width of the light image overlay part so as to increase the amount of exposure of the overlay part. Note that in the same way as the case of FIG. 10A to FIG. 10C, it is also possible to change the positions of the density filters F1 and F2 to change the relative positions without making the master reticles R1 and R2 move.

If now desiring to increase the amount of exposure at the overlay part by exactly 1%, it is sufficient to increase the width of the overlay part by exactly 10 μm. Therefore, at the time of the exposure of the second shot area on the substrate 4, the substrate 4 is made to move in a step from the exposure position of the first shot area by exactly 21000 μm−10 μm=20990 μm.

Further, as shown in FIG. 11A, the blind 111A and blind 111B and the master reticle R1 are moved in the D3 direction in the figure by exactly the amount of one pattern formed on the master reticle R1, that is, 5·α μm. In FIG. 11A, the blind 111A and the blind 111B move, so the illuminated area for the master reticle R1 becomes the same as the case of FIG. 9A. As shown in FIG. 1A, in this case, the image Im5 of the pattern "1" to the pattern "11" is formed.

After exposure of the first shot area, as explained above, the substrate 4 is made to move by exactly 20990 μm to position the second shot area at the exposure position. Further, the blinds 111A and 111B and the master reticle R2 are made to move from the position shown in FIG. 9B in the direction with no overlay part, that is, in the D4 direction in FIG. 11B, by exactly 5·α μm. As shown in FIG. 11B, in this case, the image Im6 of the pattern "7" to the pattern "17" is formed.

These image Im5 and image Im6 are images similar to the image Im1 and image Im2 shown in FIG. 9A to FIG. 9C, but the exposure profiles and the positions where the images are formed on the substrate 4 differ. For example, comparing the image Im5 in FIG. 11A and the image Im1 in FIG. 9A, the image Im1 has a constant exposure profile from the image of the pattern "1" to the image of the pattern "6", but the image Im5 has a constant exposure profile from the image of the pattern "1" to the image of the pattern "7". That is, the location of the constant exposure profile is one pattern's distance longer compared with the case of the image Im1.

Further, the image Im1 is an exposure profile linearly attenuating from the image of the pattern "7" to the image of the pattern "11". The amount of exposure gently becomes 0 at the end of the image of the pattern "11". As opposed to this, the image Im5 linearly attenuates from the image of the pattern "8" to the image of the pattern "11". The section having this profile is 1 pattern's distance shorter than the image Im1. Further, it differs in the point that the amount of exposure sharply becomes 0 from a certain value at the end of the image of the pattern "11".

The image Im5 shown in FIG. 11A and the image Im6 shown in FIG. 11B are stitched in the positional relationship shown in FIG. 11C. That is, the image from the pattern "7" to the pattern "11" is exposed at the overlay part. That is, by making the step pitch SP1 of the substrate 4 SP1−SP3=21000 μm−10 μm=20990 μm and performing exposure by making the master reticles R1 and R2 move in the D3 direction and D4 direction compared with the case shown in FIG. 9A to FIG. 9C, the amount of exposure at the overlay part is increased.

In FIG. 11C, since the amount of exposure at the overlay part of the profile PF31 of the image Im5 and the profile PF32 of the image Im6 increases, the profile of exposure at the overlay part becomes the profile PF33.

Note that as shown in FIG. 11A and FIG. 11B, the blinds 111A and 111B are used to block part of the light-attenuating parts 123 of the density filters F1 and F2, but this is because there are no patterns at the corresponding parts of the mask. As a result, in FIG. 11C, the width of the reduced light image overlay part appears not to change, but when there are no blinds 111A and 111B or other light-blocking members, the width of the reduced light image overlay part changes (increases).

When increasing the amount of exposure at the overlay part by the method shown in FIG. 11A to FIG. 11C, as shown in FIG. 11A, the profile of exposure PF31 at the end of the pattern "11" sharply changes and, as shown in FIG. 11B, the profile of exposure PF3 at the end of the pattern "7" sharply changes. When there are such sharp changes, there may be the possibility of the line width of the patterns formed at those locations also sharply changing. Next, the method of solving this problem will be explained.

FIG. 12A to FIG. 12C are views of a modification of the relative positional relationship among the density filters, blinds, and master reticles in the case of increasing the amount of exposure of the overlay part by increasing the width of the reduced light image overlay part. Note that in the same way as the case of FIG. 10A to FIG. 10C and FIG. 11A to FIG. 11C, it is also possible to change the positions of the density filters F1 and F2 to change the relative positions without moving the master reticles R1 and R2.

In FIG. 11A, the blind 111A and the blind 111B were made to move together, but FIG. 12A differs in the point that only the blind 111A is made to move in the D3 direction in the figure. Since the blind 111B is not made to move, an image Im7 including the image of the pattern "12" not obtainable in FIG. 11A is obtained. In this case, an exposure profile PF41 becoming gently 0 at the end of the pattern "12" is obtained. Further, in FIG. 11B as well, the blind 111A and the blind 111B were made to move together, but FIG. 12B differs in the point that only the blind 111B is made to move in the D4 direction in the figure. Since the blind 111A is not made to move, an image Im8 including the image of the pattern "6" not obtainable in FIG. 11B is obtained and an exposure profile PF42 becoming gently 0 at the end of the pattern "6" is obtained.

The image Im7 shown in FIG. 12A and the image Im8 shown in FIG. 12B are stitched in the positional relationship shown in FIG. 12C. That is, the image from the pattern "6" to the pattern "12" is exposed at the overlay part. That is, the step pitch SP1 of the substrate 4 is SP1–SP3 in the same way as the case of FIG. 11A to FIG. 11C. The amount of movement of the master reticles R1 and R2 is also similar to the case of FIG. 11A to FIG. 11C. The patterns drawn on the master reticles R1 and R2, however, are extended or enlarged in the direction of the overlay part. In FIG. 12A, the blind 11B is not moved and in FIG. 12B the blind 111A is not moved, so the width of the overlay part is increased. In this case, the profile of the amount of exposure at the overlay part becomes the profile PF43 and changes gently compared with the profile of exposure PF33 of FIG. 12C. It is therefore possible to suppress sharp changes in the line widths.

As explained above, by controlling the relative positions of the blinds 111, density filters Fj, master reticles Ri, and substrate 4, it is possible to correct a change in the combined amount of exposure of the overlay part accompanying a change in the illumination conditions. Due to this, it becomes possible to set the illumination conditions of the illumination optical system 1 so that the OPE characteristic becomes optimal in accordance with the pattern size and density of the patterns formed on the master reticle. Further, no change in the width of the overlay part occurs due to a change in the illumination conditions (that is, a change in the incidence angle or range of angle of the exposure light IL striking the density filter Fj) and the combined amount of exposure at the overlay part can be adjusted with a high accuracy. As a result, it is possible to form patterns of uniform line widths with a high accuracy. Note that it is not always necessary to set the combined amount of exposure at an overlay part to be equal to the amount of exposure other than the overlay part. It is also possible to use the above method to set the combined amount of exposure of the overlay part different from the amount of exposure at other than the overlay part, that is, to be smaller than or larger than the amount of exposure at other than the overlay part.

In the embodiment explained above, the amount of defocus of a density filter Fj with respect to the reticle conjugate plane PL1 was adjusted to adjust the width of the overlay part, that is, the width of the image of the light-attenuating part 123 of the density filter Fj on the substrate 4, but it is also possible to prepare in advance a plurality of density filters set with various widths of light-attenuating parts 123 and switch the density filter Fj in accordance with the set illumination conditions.

For example, in the example explained above, when transferring patterns with a pattern size of 360 nm on the substrate 4, by setting the illumination σ to 0.55, using a density filter with a width [a] of the light-attenuating part 123 of 1368 μm, and making the amount of defocus [d] of the density filter with respect to the reticle conjugate plane PL1 1500 μm, the width of the overlay part was made 1000 μm (1 mm).

To adjust the width of the overlay part by switching the density filters without changing the amount of defocus [d] with respect to the reticle conjugate plane PL1, it is sufficient to use a density filter formed with a light-attenuating part 123 having the width [a] shown by equation (8) modified from the above equation (6).

$$a = WG3/(M \cdot N) = 2 \cdot d \cdot \tan\theta - b \tag{7}$$

Specifically, if entering into equation (7) WG=1000 μm as the width of the overlay part, M=2, M=¼, d=1500 μm, θ=18.6, and b=0, a=990 μm. That is, when transferring patterns of a pattern size of 200 nm, it is sufficient to set the illumination σ to 0.85 so that the OPE characteristic becomes the best and replace the density filter with one formed with a light-attenuating part 23 with a width of 990 μm without changing the amount of defocus 1500 μm with respect to the reticle conjugate plane PL1.

Note that the plurality of density filters provided in advance are preferably not designed focusing only on the changes in width at the overlay parts, but are adjusted in dot pitch so as to be able to correct changes in the combined amount of exposure accompanying changes in the illumination conditions. Further, instead of switching density filters, by for example configuring the density filter by liquid crystal elements etc., it is possible to change the width [a] of the light-attenuating part 123 in accordance with changes in the illumination conditions.

In the above explained embodiment, the explanation was made taking as an example the case of use of a density filter as the setting device (light attenuating means), but it is possible to use a setting device other than a density filter. For example, it is possible to achieve the same function as a density filter by a blind mechanism BL such as shown in FIG. 13. FIG. 13 is a view of another example of the configuration forming a slanted profile.

The blind mechanism BL has a configuration basically the same as the reticle blind mechanism 110 shown in FIG. 1 and is comprised of four movable blinds 127A to 127D and their drive mechanisms (not shown). By setting these four blinds 127A to 127D to suitable positions, the front edges 128A to 128D of the blinds 127A to 127D form a rectangular illuminated area in the field of the projection optical system 3.

This illuminated area is basically set to a size corresponding to the shot area on the substrate 4 (reticle patterns to be transferred to shot area). During exposure, one or more of these four blinds 127A to 127D are continuously moved at a predetermined speed so as to enter into or retract from the optical path of the illumination optical system 1 through which the exposure light IL passes, whereby it is possible to set at a slant the amount of light passing through the area through which the front edges 128A to 128D of the blinds 127A to 127D move.

By moving the blinds 127A to 127D overall or selectively at the part corresponding to the stitched part of the shot areas, it is possible to reduce at a slant the amount of exposure at the stitched part the further to the outside. Due to this, a function similar to a density filter is realized. This light attenuating blind mechanism BL is somewhat more complicated in configuration than a density filter in the point of requiring the drive mechanisms for the blinds 127A to 127D, but there is no need to prepare and handle a plurality of density filters in accordance with the shot areas and a single mechanism can be used for flexible handling.

Even when using the blind mechanism BL shown in FIG. 13, by for example arranging the blinds 127A to 127D in the state defocused from the reticle conjugate plane, a similar problem arises as with density filters. Therefore, the blind mechanism BL as a whole is configured to be able to move in the Z-direction in accordance with a change in the illumination conditions. Further, the blinds 127A to 127D set the amount of passing light in accordance with their movement, so the area of movement of the front edges 128A to 128D corresponds to the light-attenuating part 123 of a density filter Fj in the state illuminated by the exposure light IL. Therefore, by changing the amount of movement of at least one of the blinds 127A to 127D (for example, the blind moved during illumination by the exposure light IL for gradually reducing the cumulative exposure profile of the exposure light IL on the substrate 4 so as to gradually decrease at the peripheral part (overlay part)) in a direction (in FIG. 1, the X-direction or Y-direction) perpendicular to the direction for changing the area through which the front edges 128A to 128D move in accordance with changes in the illumination conditions (in FIG. 1, the Z-direction), it becomes possible to correct a change in the width of the overlay part. Further, when using a blind mechanism BL, to correct a change in the width of an overlay part, it is sufficient to adjust the position (amount of movement) of the blind mechanism BL in one or more of the direction along the optical axis AX of the illumination optical system 1 (Z-direction) and a direction perpendicular to the optical axis (X-direction or Y-direction). Further, it is also possible to make joint use of the blind mechanism BL with a density filter Fj. In this case, to correct a change in the width of an overlay part, it is sufficient to adjust the position of at least one of the blind mechanism BL and density filter Fj. Further, the blind mechanism BL may be provided separately from the above-mentioned reticle blind mechanism 110, but by making joint use of the above reticle blind mechanism 110, it is not necessary to specially provide a blind mechanism BL.

In the above embodiment, the explanation was given of a reticle exposure apparatus designed to use a plurality of master reticles Ri and successively transfer patterns on a blank 4 while stitching them, but the invention may be similarly applied to a device exposure apparatus designed to use a plurality of working reticles produced in this way or produced by another method and successively transfer and stitch patterns on a device substrate (wafer, glass plate, etc.) instead of a substrate (blank) 4 (for example, an exposure apparatus for production of semiconductor devices, liquid crystal elements, etc.)

In the above embodiment, the illumination profile detection sensor 126 having the fine aperture 54 was used to detect the profile of intensity of the exposure light IL, but for example it is also possible to use a line sensor or a one-dimensional or two-dimensional CCD etc. to detect the exposure light IL so as to try to shorten the time for measurement of the profile of intensity. Further, in the above embodiment, the density filter Fj was provided in the illumination optical system, but for example it is also possible to provide it in proximity to the reticle or provide it at or near an intermediate image forming surface when the projection optical system 3 forms an intermediate image (primary image) of the reticle patterns. Further, when using a rod integrator (inside surface reflection type integrator) as the optical integrator 106, it is also possible for example to provide the density filter near the emission surface of the rod integrator arranged substantially conjugate with the pattern formation surface of the reticle. Further, it is also possible to provide the reticle blind mechanism 110 outside of the illumination optical system in the same way as the density filter Fj. Further, the reticle blind mechanism 110 was made one having four blinds 111, but it is also possible to use for example two L-shaped light-blocking plates. It may be configured in any way.

Note that, in the above embodiment, the shot area was made a rectangular shape, but it does not necessarily have to be a rectangular shape. It may also be a pentagon, hexagon, or other polygon in shape. Further, the shot areas do not have to be the same shapes and may be made different shapes or sizes. Further, the portions to be stitched do not have to be rectangular and may be zigzag strips, serpentine strips, and other shapes as well. Further, the "stitching" in the specification of the present application is used in the sense including not only stitching of patterns, but also arrangement of patterns in a desired positional relationship (that is, with no stitching portions between patterns). Further, patterns do not have to be transferred to the overlay parts of a plurality of shot areas (peripheral parts exposed multiple times).

It is also possible to enlarge the device pattern to be formed on the working reticle 34, partition the enlarged device pattern into element patterns, divide these into for example dense patterns and isolated patterns, and then form them on the master reticles to thereby eliminate or reduce the stitching portions of parent patterns on the substrate 4. In this case, depending on the device pattern of the working reticle, sometimes the parent pattern of one master reticle is transferred to a plurality of areas on a substrate 4, so the number of master reticles used for production of the working reticle can be reduced. Further, it is also possible to partition the enlarged pattern into functional block units of for example a CPU, DRAM, SRAM, A/D converter, and D/A converter and form one or more functional blocks at a plurality of master reticles. The exact same is true for an exposure apparatus for device production producing a semiconductor device etc. It is also possible to divide enlarged patterns of circuit patterns to be formed on a device substrate into functional block units and form them on a plurality of working reticles. Further, the patterns transferred to the plurality of shot areas with peripheral parts partially overlapped on the substrate do not have to be all different. For example, the patterns to be transferred to two or more shot areas may also be the same. Further, in the above embodiment, a plurality of reticles were used to expose a plurality of shot areas on the substrate by the stitching system, but it is also possible to use just one reticle on which a plurality of patterns are formed and similarly perform stitching type exposure. Further, the shot areas on the substrate may be exposed not only by the stationary exposure system employed in the above embodiment, but also by a scan exposure system synchronously moving the reticle and substrate. In this scan exposure system, the density filter is also moved synchronously with the movement of the reticle and the substrate. Further, according to the above embodiment, even if the illumination conditions are changed at the time of stitching type exposure (stitch exposure), it is possible to form fine patterns of uniform line widths over all of the plurality of shot areas where peripheral parts partially overlap on the substrate. Even if patterns with different line widths are mixed, it becomes possible to form each pattern with accurate line widths, that is, possible to form the mixed patterns on the substrate with a high fidelity.

In the above embodiment, as the illumination light for exposure, KrF excimer laser light (wavelength 248 nm) was used, but it is also possible to use g-rays (wavelength 436 mm), i-rays (wavelength 365 nm), ArF excimer laser light (wavelength 193 nm), $F_2$ laser light (wavelength 157 nm), $Ar_2$ laser light (wavelength 126 nm), etc. In an exposure apparatus using an $F_2$ laser as a light source, for example a catiodioptic system is employed as the projection optical system, all of the refraction optical members (lens elements) used for the illumination optical system and projection optical system are made fluorite, the air in the laser light source, illumination optical system, and projection optical system is replaced with for example helium gas, and helium gas is filled between the illumination optical system and projection optical system and between the projection optical system and substrate.

Further, in an exposure apparatus using an $F_2$ laser, the reticle or density filter used is one made of fluorite, fluorine-doped silica glass, magnesium fluoride, LiF, $LaF_3$, and lithium-calcium-aluminum fluoride (LiCaAlF crystal), or rock crystal.

Further, instead of an excimer laser, it is also possible to use a harmonic of a YAG laser or other solid laser having an oscillation spectrum at any of a wavelength of 248 nm, 193 nm, and 157 nm.

Further, it is possible to use an infrared region or visible region single wavelength laser light emitted from a DFB semiconductor laser or fiber laser amplified by for example an erbium (or both erbium and yttrium) doped fiber amplifier and use the harmonic obtained by converting the wavelength to ultraviolet light using a nonlinear optical crystal.

For example, if the oscillation wavelength of the single wavelength laser is made a range of 1.51 to 1.59 μm, an 8th harmonic of an oscillation wavelength in the range of 189 to 199 nm or a 10th harmonic of an oscillation wavelength in the range of 151 to 159 μm is output. In particular, if the oscillation wavelength is made one in the range of 1.544 to 1.553 μm, ultraviolet light of an 8th harmonic in the range of 193 to 194 nm, that is, a wavelength substantially the same as that of an ArF excimer laser, is obtained. If the oscillation wavelength is made one in the range of 1.57 to 1.58 μm, ultraviolet light of a 10th harmonic in the range of 157 to 158 nm, that is, a wavelength substantially the same as that of an $F_2$ laser, is obtained.

Further, if the oscillation wavelength is made one in the range of 1.03 to 1.12 μm, a 7th harmonic of an oscillation wavelength in the range of 147 to 160 nm is output. In particular, if the oscillation wavelength is made one in the range of 1.099 to 1.106 μm, ultraviolet light of a 7th harmonic in the range of 157 to 158 nm, that is, a wavelength substantially the same as that of an $F_2$ laser, is obtained. Note that as the single wavelength oscillation laser, a yttrium-doped fiber laser is used. Further, it is also possible to use light of a soft X-ray region emitted from a laser plasma light source or SOR, for example, EUV (extreme ultraviolet) light of a wavelength of 13.4 nm or 11.5 nm.

Further, the present invention is not limited to a step-and-repeat type exposure apparatus and may also be applied to a step-and-scan type exposure apparatus. The projection optical system is not limited to a reduction system and may also be an equal magnification system or an enlargement system (for example, an exposure apparatus for producing a liquid crystal display or plasma display). Further, the projection optical system may be any of a catoptric system, a dioptric system, and a catadioptric system. Note that the present invention may also be applied to a proximity type exposure apparatus, a mirror projection aligner, a liquid immersion type exposure apparatus where a liquid is filled between the projection optical system PL and wafer as disclosed in for example International Publication WO99/49504, etc.

Further, the present invention may also be applied to apparatuses other than an exposure apparatus used for the production of a photomask or semiconductor device, such as an exposure apparatus transferring a device pattern on a glass plate used for the production of a display including liquid crystal display elements, an exposure apparatus transferring a device pattern on a ceramic wafer used for production of a thin film magnetic head, an exposure apparatus used for production of a pickup element (CCD), micromachine, DNA chip, etc., and the, like.

In an exposure apparatus used for other than production of a photomask (working reticle), the exposure substrate (device substrate) to which the device pattern is to be transferred is held on the substrate stage 6 by vacuum or electrostatics. In an exposure apparatus using EUV rays, however, a reflection type mask is used, while in a proximity type X ray exposure apparatus or electron beam exposure apparatus etc., a transmission type mask (stencil mask, membrane mask) is used, so a silicon wafer etc. is used as the master of the mask.

The exposure apparatus of the present embodiment may be produced by assembling an illumination optical system comprised of a plurality of lenses and a projection optical system into the body of the exposure apparatus and optically adjusting them, attaching the reticle stage or substrate stage comprised of the large number of mechanical parts to the exposure apparatus body and connecting the wiring and piping, and further performing overall adjustment (electrical adjustment, confirmation of operation, etc.) Note that the exposure apparatus is desirably manufactured in a clean room controlled in temperature and cleanness etc.

The semiconductor device is produced through a step of design of the functions and performance of the device, a step of production of a working reticle by the exposure apparatus of the above embodiment based on the design step, a step of production of a wafer from a silicon material, a step of transferring patterns of the reticle on to a wafer using an exposure apparatus of the present embodiment, a step of assembly of the device (including dicing, bonding, packaging, etc.), and an inspection step.

Note that the present invention is of course not limited to the above embodiments and may be modified in various ways within the scope of the invention.

According to the present invention, since the cumulative amount of energy is corrected so that the width of the peripheral parts set at a slant does not change, it is possible to use illumination conditions optimal for the patterns to be transferred without restriction. Further, it becomes possible to make the cumulative amount of energy of the overlay parts where the peripheral parts and the peripheral parts adjoining them overlap even without unevenness and possible to make the cumulative amounts of energy at overlay parts and parts other than overlay parts substantially match. As a result, it becomes possible to form the patterns with the fine line widths targeted with a high accuracy.

The present disclosure relates to subject matter contained in Japanese Patent Application No. 2002-20336, filed on Jan. 29, 2002, the disclosure of which is expressly incorporated herein by reference in its entirety.

The invention claimed is:

1. An exposure apparatus which exposes a plurality of areas where peripheral parts partially overlap on a sensitive object with an energy beam, said exposure apparatus comprising:
an illumination system having an optical axis perpendicular to a predetermined plane on which a pattern is placed, that illuminates the pattern with the energy beam and includes a changing device on the optical axis which changes an intensity distribution of the energy beam on a pupil plane of the illumination system so as to change an illumination condition of the pattern with the energy beam;
a setting device provided in the illumination system, which defines a distribution of a cumulative amount of energy on one of the plurality of areas due to the exposure of the one area with the energy beam, the distribution having a slope portion at an overlapped peripheral part of the one area, in which the cumulative amount of energy is gradually decreased; and
a correction device which corrects a change in a width of the slope portion caused by the change of the illumination condition.

2. An exposure apparatus as set forth in claim 1, wherein the setting device includes a density filter having an attenuating part which gradually decreases an intensity of the energy beam, and the energy beam from the attenuating part is irradiated onto the overlapped peripheral part of the one area.

3. An exposure apparatus as set forth in claim 2, wherein said setting device includes a position adjustment device which adjusts the position of the density filter in a direction along the optical axis, and
said correction device makes said correction by changing the position of said density filter in accordance with a change of said illumination condition.

4. An exposure apparatus as set forth in claim 2, wherein said setting device includes a plurality of density filters differing in widths of said-attenuating parts, and
said correction device makes said correction by switching the density filter arranged in an optical path of the illumination system in accordance with a change of said illumination condition.

5. An exposure apparatus as set forth in claim 2, wherein the setting device includes a blind device having light-blocking plates moving during irradiation of said energy beam and a position adjusting device which adjusts the position of said blind device in at least one of a direction along the optical axis and a direction perpendicular to said optical axis, and
said correction device makes said correction by changing the position of said blind device in accordance with a change of said illumination condition.

6. An exposure apparatus as set forth in claim 1, wherein said correction device makes said correction by adjusting optical characteristics of a part of the illumination system between the setting device and the predetermined plane.

7. An exposure apparatus as set forth in claim 1, wherein the cumulative amount of energy at the overlapped peripheral part of the one area is adjusted by changing the relative position of an intensity distribution of the energy beam defined by the setting device and the pattern.

8. An exposure method of exposing a plurality of areas where peripheral parts partially overlap on a sensitive object with an energy beam, said exposure method comprising:
defining a distribution of a cumulative amount of energy on one of the plurality of areas due to the exposure of the one area with the energy beam by illuminating a pattern with the energy beam via an illumination system having a setting device, the distribution having a slope portion at an overlapped peripheral part of the one area, in which the cumulative amount of energy is gradually decreased;
changing an intensity distribution of the energy beam on a pupil plane of the illumination system so as to change an illumination condition of the pattern with the energy beam; and
correcting a change in a width of the slope portion caused by the change of the illumination condition.

9. An exposure method as set forth in claim 8, wherein a position of the setting device in a direction along an optical axis of the illumination system is adjusted to correct the change in the width of the slope portion.

10. An exposure method as set forth in claim 9, wherein said setting device includes a density filter gradually decreasing an intensity of said energy beam, and a position of the density filter is adjusted to make the correction.

11. An exposure method as set forth in claim 8, wherein said setting device moves a blind device defining an illuminated area of said energy beam during irradiation of said energy beam and a position of said blind device in at least one of a direction along an optical axis of the illumination system and a direction perpendicular to the optical axis is adjusted to make the correction.

12. An exposure method as set forth in claim 8, wherein optical characteristics of a part of the illumination system between the setting device and the pattern is adjusted to make the correction.

13. An exposure method as set forth in claim 8, further comprising changing the relative position between an intensity distribution of said energy beam defined by said setting device and said pattern to adjust the cumulative amount of energy at the overlapped peripheral part of the one area.

14. A method of manufacture of a device including a step of forming circuit patterns on an object using the exposure method of claim 13.

15. An exposure apparatus which exposes a plurality of areas on a sensitive object with an energy beam, said exposure apparatus comprising:
an illumination system having an optical axis perpendicular to a predetermined plane on which a pattern is placed, that illuminates the pattern with the energy beam and includes a changing device on the optical axis which changes an intensity distribution of the energy beam on a pupil plane of the illumination system so as to change an illumination condition of the pattern with the energy beam;
an optical device provided in the illumination system, which defines an intensity distribution of the energy beam on the sensitive object, the intensity distribution having a slope portion at an edge thereof, in which the intensity is gradually decreased; and a correction device provided in the illumination system, which corrects a change in a width of the slope portion caused by the change of the illumination condition.

16. An exposure apparatus as set forth in claim 15, wherein said correction device corrects the change in the width of the slope portion by changing a position of said optical device in accordance with a change of said illumination condition.

17. An exposure apparatus as set forth in claim 15, wherein said correction device corrects the change in the width of the slope portion by adjusting optical characteristics of a part of the illumination system between the optical device and the predetermined plane.

18. An exposure apparatus as set forth in claim 15, wherein a changing device is arranged between a beam source generating said energy beam and an optical integrator of said illumination system and includes a plurality of diffraction optical elements arranged switchably in said illumination system and a plurality of optical elements movable along the optical axis of said illumination system.

19. An exposure apparatus as set forth in claim 15, wherein said optical device includes a blind device defining an illuminated area of said energy beam in said illumination system and said correction device corrects the change in the width of the slope portion by changing the position of said blind device in a direction parallel to the optical axis of said illumination system.

20. An exposure apparatus as set forth in claim 15, wherein said correction device corrects the change in the width of the slope portion by adjusting at least one of the position of said optical device in a direction parallel to the optical axis of said illumination system and optical characteristics of a part of the illumination system between the optical device and the predetermined plane.

21. An exposure apparatus as set forth in claim 15, wherein said optical device is arranged at a plane different from a conjugate plane with said predetermined plane in said illumination system and said correction device adjusts a position of said optical device in a direction parallel to the optical axis of said illumination system.

22. An exposure apparatus as set forth in claim 21, wherein said optical device includes a density filter having an attenuating part partially attenuating said energy beam on the plane different from the conjugate plane.

23. An exposure apparatus as set forth in claim 15, wherein the intensity distribution of the energy beam on the sensitive object is substantially trapezoidal in shape.

24. An exposure apparatus as set forth in claim 23, wherein an adjustment device changes a relative position between said energy beam irradiated on said pattern through said optical device and said pattern to adjust a cumulative amount of energy.

* * * * *